US011361126B1

(12) United States Patent
Aghajan

(10) Patent No.: US 11,361,126 B1
(45) Date of Patent: *Jun. 14, 2022

(54) SPECTRUM USAGE DATABASES FOR COGNITIVE RADIO

(71) Applicant: Adaptrum, Inc., San Jose, CA (US)

(72) Inventor: Hamid Aghajan, Palo Alto, CA (US)

(73) Assignee: Adaptrum, Inc., San Jose, CA (US)

( * ) Notice: Subject to any disclaimer, the term of this patent is extended or adjusted under 35 U.S.C. 154(b) by 766 days.

This patent is subject to a terminal disclaimer.

(21) Appl. No.: 16/168,659

(22) Filed: Oct. 23, 2018

Related U.S. Application Data

(63) Continuation of application No. 13/586,813, filed on Aug. 15, 2012, now Pat. No. 10,108,757.

(60) Provisional application No. 61/523,798, filed on Aug. 15, 2011.

(51) Int. Cl.
| *H04W 16/14* | (2009.01) |
| *H04W 16/18* | (2009.01) |
| *H04W 28/18* | (2009.01) |
| *H04W 72/04* | (2009.01) |
| *G06F 30/20* | (2020.01) |
| *H04W 28/16* | (2009.01) |
| *H04W 28/26* | (2009.01) |
| *H04W 28/24* | (2009.01) |

(52) U.S. Cl.
CPC ............ *G06F 30/20* (2020.01); *H04W 16/14* (2013.01); *H04W 16/18* (2013.01); *H04W 28/16* (2013.01); *H04W 28/18* (2013.01); *H04W 28/24* (2013.01); *H04W 28/26* (2013.01); *H04W 72/04* (2013.01)

(58) Field of Classification Search
CPC ..... H04W 16/14; H04W 24/10; H04W 24/08; H04W 64/00; H04W 72/0453; H04W 24/02; H04W 24/04; H04W 4/029; H04W 48/16; H04W 16/18; H04W 84/12; H04W 24/00; H04W 28/16; H04W 16/10; H04W 48/08; H04W 74/08; H04B 17/309; H04B 17/27; G06F 30/20; H04L 27/0006
See application file for complete search history.

(56) References Cited

U.S. PATENT DOCUMENTS

| 6,608,994 B1 | 8/2003 | Wegener et al. |
| 7,424,268 B2 | 9/2008 | Diener et al. |
| 8,375,032 B2 | 2/2013 | Birdwell et al. |
| 8,478,765 B2 | 7/2013 | Barton et al. |
| 8,615,263 B2 | 12/2013 | Madon et al. |
| 9,223,020 B1 | 12/2015 | Crosmer et al. |

(Continued)

OTHER PUBLICATIONS

Telecommunication Standardization Sector, "Terms and Definitions Related to Quality of Service and Network Performance Including Dependability", "International Telecommunication Union", Aug. 12, 2004, Publisher: International Telecommunication Standardization Sector.

*Primary Examiner* — Philip Sobutka
(74) *Attorney, Agent, or Firm* — Aka Chan LLP

(57) ABSTRACT

Access to data representations of relatively dynamic actual usage and patterns of spectrum usage across channels, geographies (locations), and times can be advantageous in planning for resource utilization, and in structuring pricing for spectrum resources. Actual usage of spectrum resources can vary dynamically. Significant opportunities to advantageously utilize spectrum resources can be identified from relatively dynamic representations of actual usage.

20 Claims, 22 Drawing Sheets

(56) References Cited

U.S. PATENT DOCUMENTS

| | | | |
|---|---|---|---|
| 9,538,388 B2 | 1/2017 | Mchenry et al. | |
| 10,108,757 B1* | 10/2018 | Aghajan | H04W 24/10 |
| 2004/0078367 A1 | 4/2004 | Anderson et al. | |
| 2005/0275626 A1 | 12/2005 | Mueller et al. | |
| 2006/0083205 A1* | 4/2006 | Buddhikot | H04W 28/16 |
| | | | 370/338 |
| 2009/0046625 A1 | 2/2009 | Diener et al. | |
| 2010/0054279 A1 | 3/2010 | Feldbauer et al. | |
| 2010/0332474 A1 | 12/2010 | Birdwell et al. | |
| 2010/0332475 A1 | 12/2010 | Birdwell et al. | |
| 2011/0034179 A1 | 2/2011 | David et al. | |
| 2012/0095982 A1 | 4/2012 | Lennington et al. | |
| 2013/0054603 A1 | 2/2013 | Birdwell et al. | |
| 2017/0201889 A1 | 7/2017 | Mchenry et al. | |

* cited by examiner

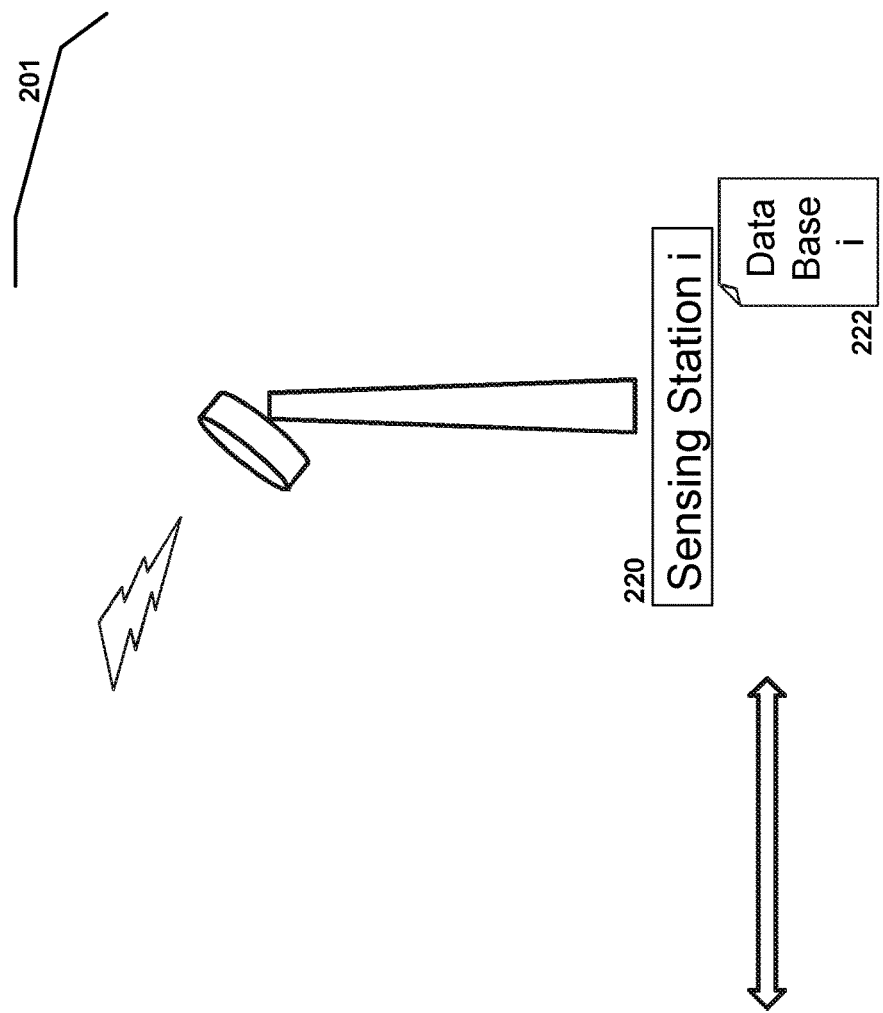
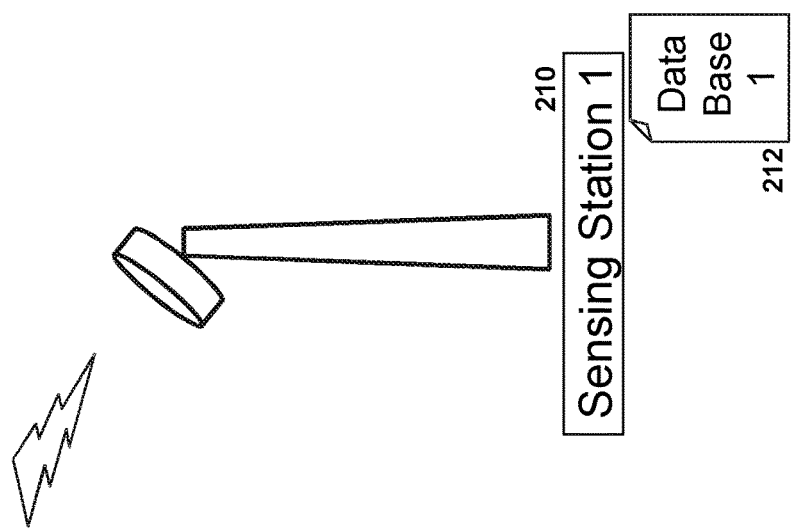
FIG 2

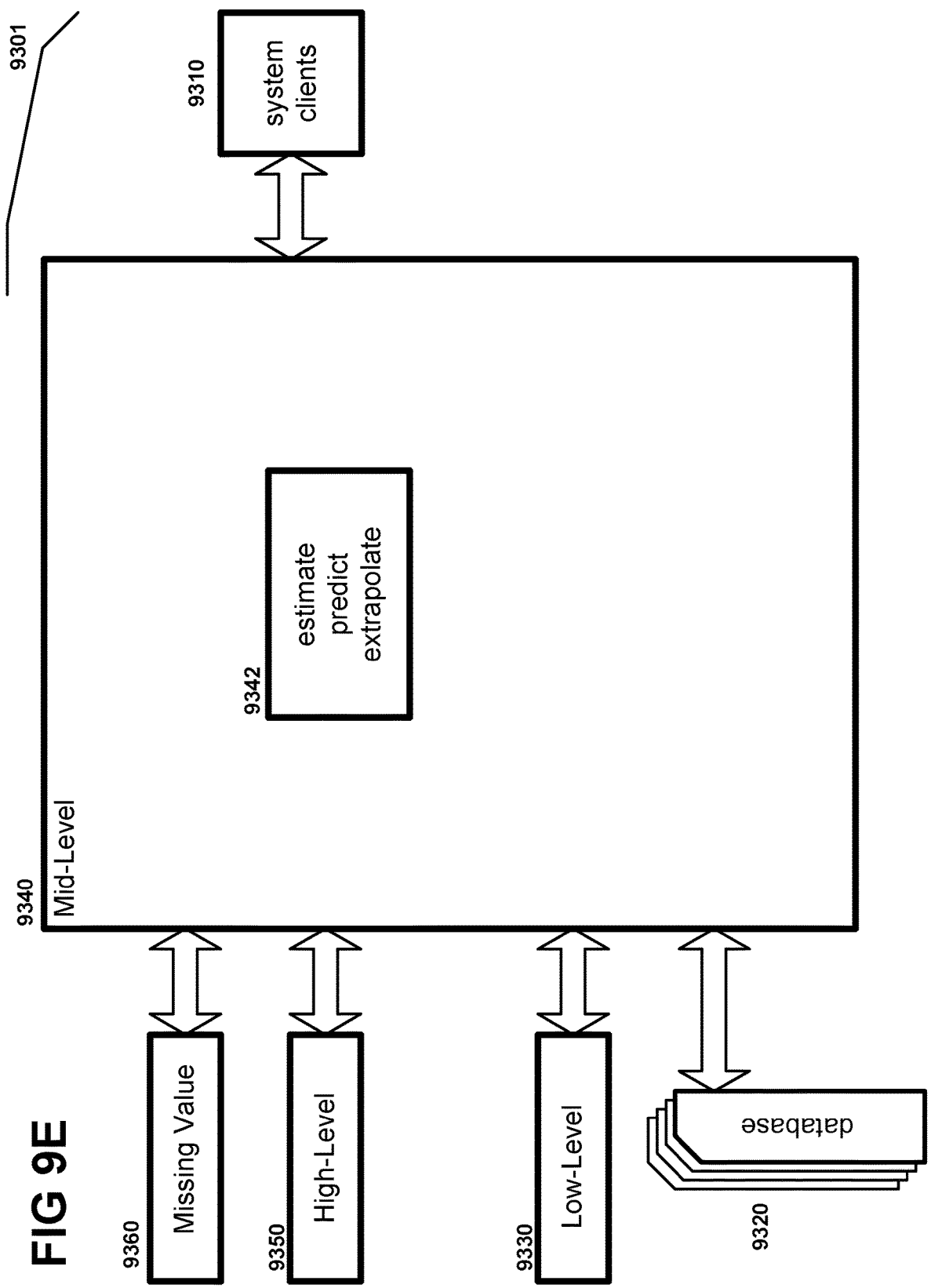

SPECTRUM USAGE DATABASES FOR COGNITIVE RADIO

CROSS-REFERENCE TO RELATED APPLICATIONS

This patent application is a continuation of U.S. patent application Ser. No. 13/586,813, filed Aug. 15, 2012, issued as U.S. Pat. No. 10,108,757 on Oct. 23, 2018, which claims the benefit of U.S. patent application 61/523,798 filed on Aug. 15, 2011. These applications are incorporated by reference along with all other references cited in this application.

BACKGROUND OF THE INVENTION

A variety of entities, including government agencies, can provide assignments (such as licenses) for segments of radio frequency spectrum. These assignments can be for specified geographic areas, for specified times, and for unlicensed, shared, and/or secondary license use. These assignments can provide relatively static prescriptions for use of spectrum resources.

Access to data representations of relatively dynamic actual usage and patterns of usage across channels, geographies (locations), and times can be advantageous in planning for resource utilization, and in structuring pricing for spectrum resources. Actual usage of spectrum resources can vary dynamically. Significant opportunities to advantageously utilize spectrum resources can be identified from relatively dynamic representations of actual usage.

Thus there is a need to provide systems and methods for providing relatively dynamic representations of actual usage of spectrum resources across channels, locations, and times. Representations of direct measurements of usage can be helpful in developing additional advantageous information, such as models and/or descriptions of patterns and trends in usage. Thus there is a need to provide systems and methods for providing such additional information.

Thus there is a need for spectrum usage sensing techniques for generating database(s) that represent spectrum usage, and for techniques to support modeling of usage and development of pricing structures.

A cognitive radio system can scan a range of spectrum by applying appropriately granular temporal sampling time intervals and thereby sense specific transmission activities in specific bands and/or channels and/or frequencies of a target spectral range. Sampling across a specific range of spectrum can be performed with a granularity that corresponds to specific communication protocols, such as protocols based on orthogonal frequency-division multiplexing (OFDM) signaling schemes. A sampling campaign can apply such sampling techniques across specified ranges of spectrum, which can include unlicensed and/or secondary license spectrum. A cognitive radio system can employ such a sampling campaign for instances of sampling times, and thereby determine measures of occupancy for specified range of spectrum. In some embodiments, a specified range of spectrum can correspond to one or more specified channels.

A cognitive radio system that can sense such specific transmission activities can comprise a Sensing Station. A Sensing Station can provide sensing capabilities for specified ranges of spectrum, for specific geographic locations. A specified geographic area comprising locations sensed by a Sensing Station can be described as a corresponding coverage area.

A database comprising measured usage for specific geographic locations can thereby be developed. Such a Spectrum Usage Database (SUD) can comprise measures of occupancy corresponding to granular sampling along dimensions of frequency (spectrum), time, and location. Such a database can be representative and/or support modeling of actual spectrum usage for coverage areas that correspond respectively to specific Sensing Stations. Such a database can also be employed to model and/or derive spectrum usage for geographic locations that correspond to relatively sparse measurements. That is, measures of occupancy can be developed by modeling etc., for locations that have few or even essentially no corresponding measurements.

Diagram 101 depicts a specified geography 102 containing Sensing Stations 112, 122, and 132, each with a respectively corresponding coverage area 110, 120, and 130. The area 140 is in some sense not covered by the depicted coverage areas. That is, area 140 constitutes a geographic location that corresponds to relatively sparse measurements. Thus area 140 can be a candidate for the development of measures of occupancy modeled and/or derived from spectrum usage database(s) corresponding to other coverage areas, such as those for areas 110, 120, and/or 130.

BRIEF DESCRIPTION OF THE DRAWINGS

FIG. 2 shows sensing stations coupled with each other, and with local storage.

FIG. 9E shows mid-level processing.

DETAILED DESCRIPTION OF INVENTION

Figure 1:
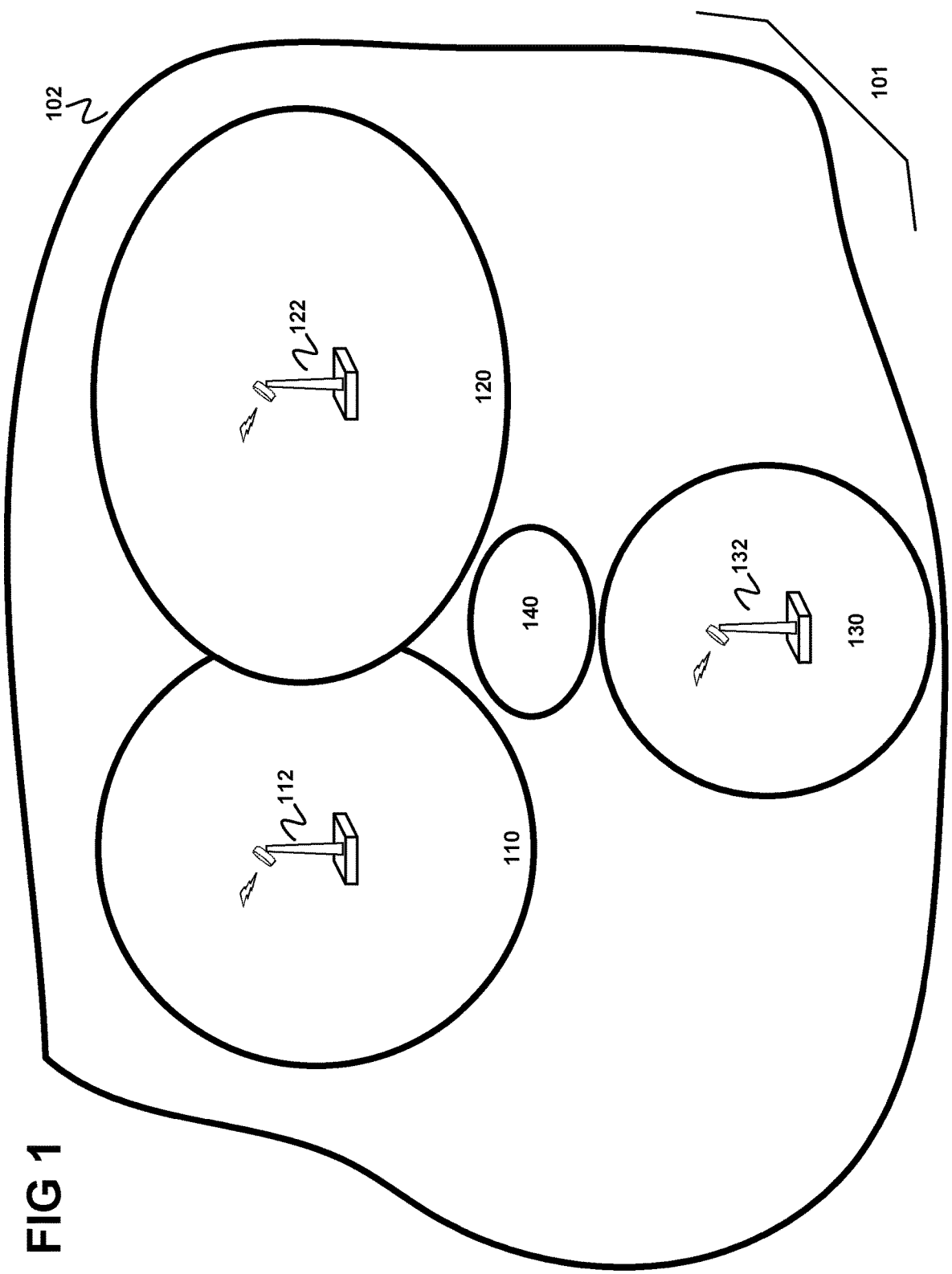
FIG. 1 shows sensing stations and coverage regions within a geography.
Figure 3:
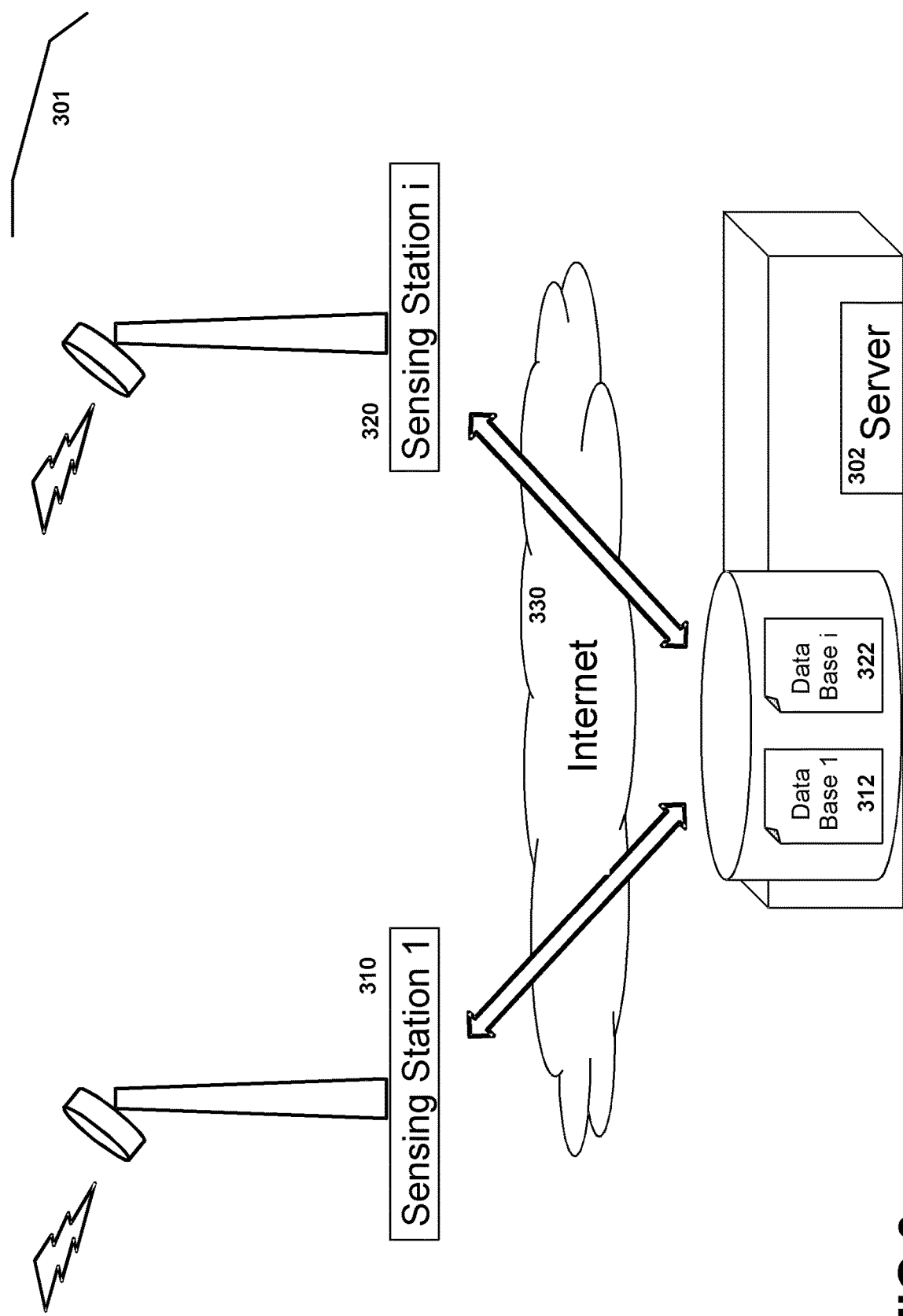
FIG. 3 shows sensing stations coupled with each other by a network.
Figure 4:
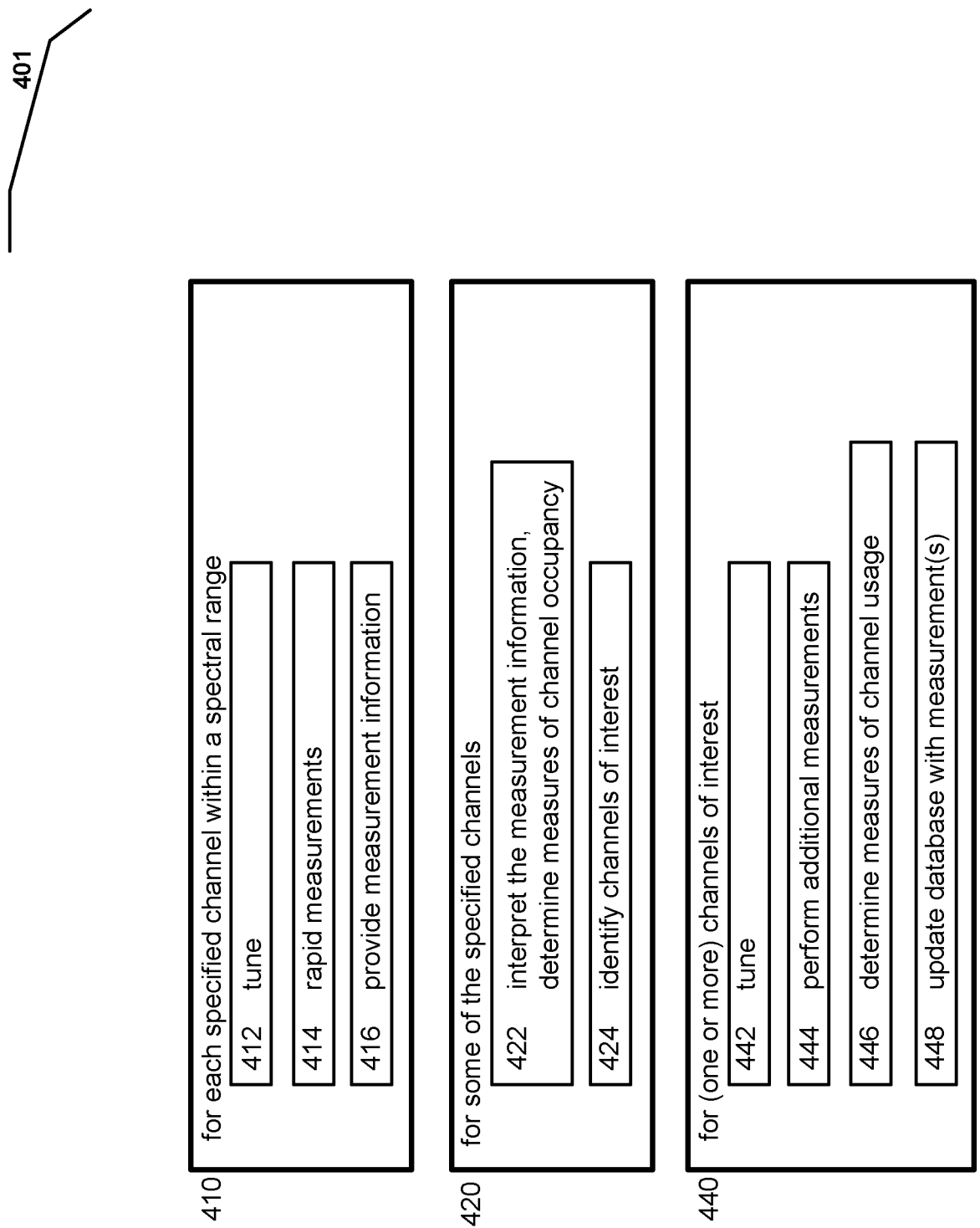
FIG. 4 shows heterogeneous sampling and monitoring.
Figure 5:
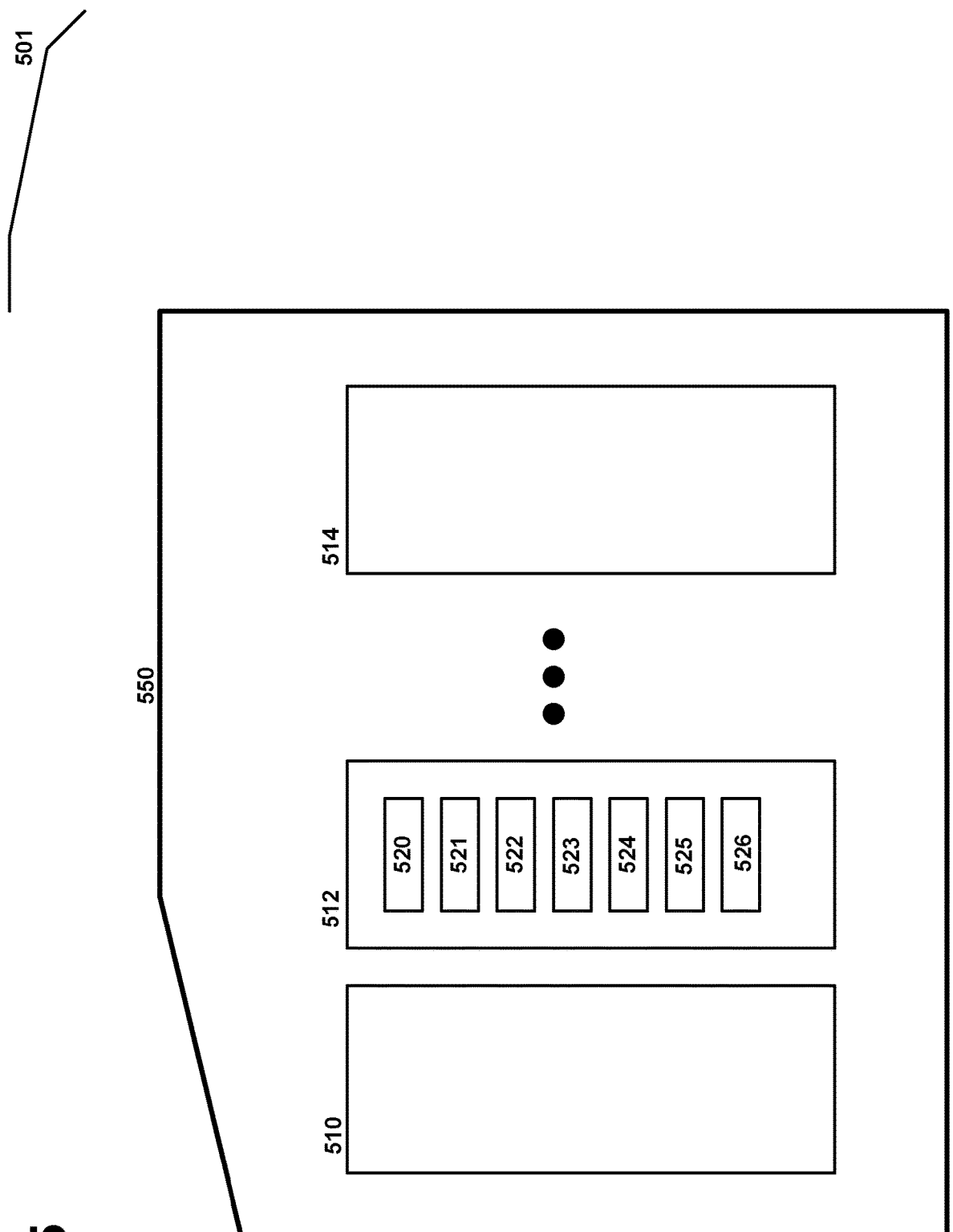
FIG. 5 shows spectrum usage database (SUD) records.
Figure 6:
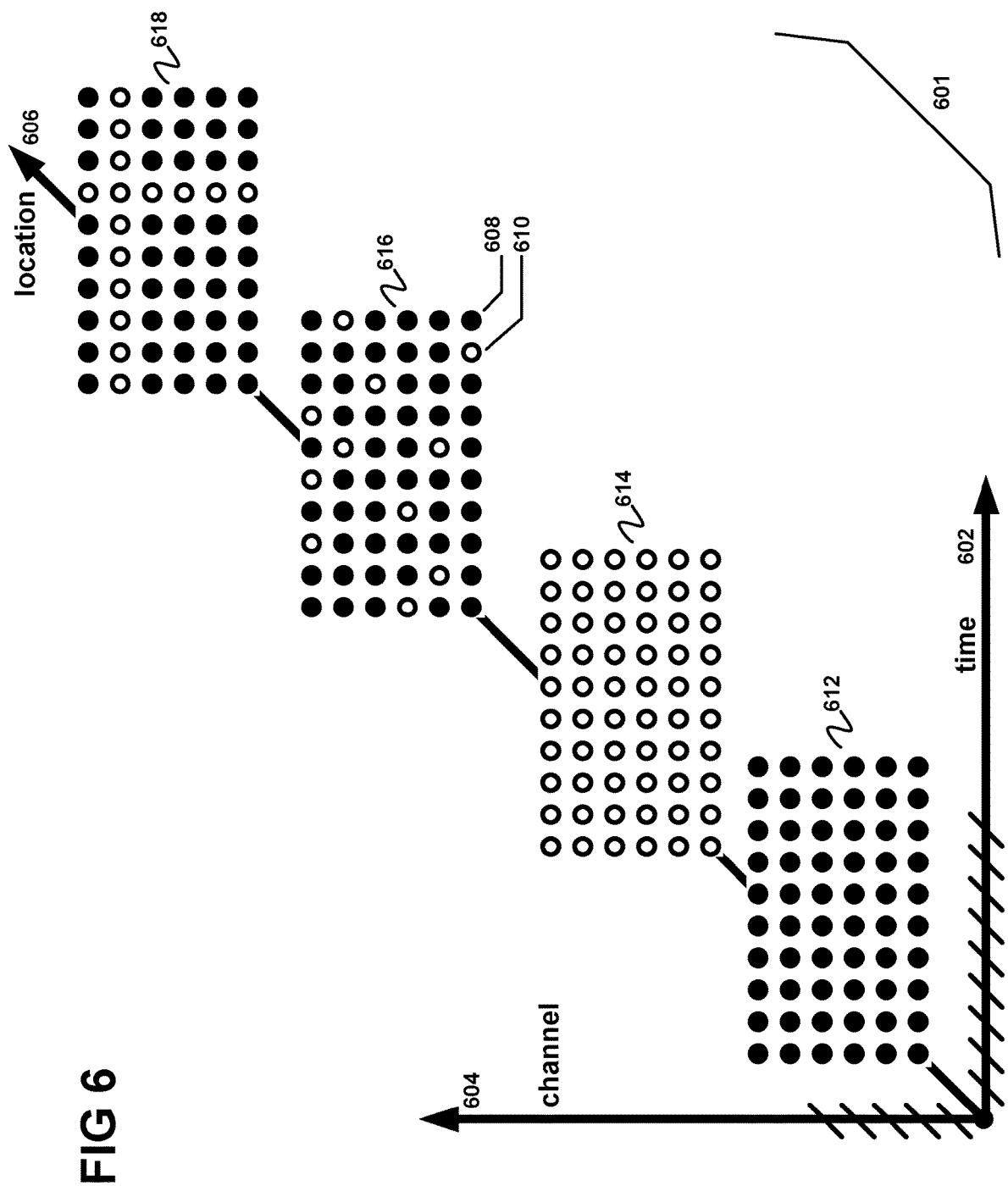
FIG. 6 shows examples of sampling corresponding to entries in an embodiment of a SUD.
Figure 7:
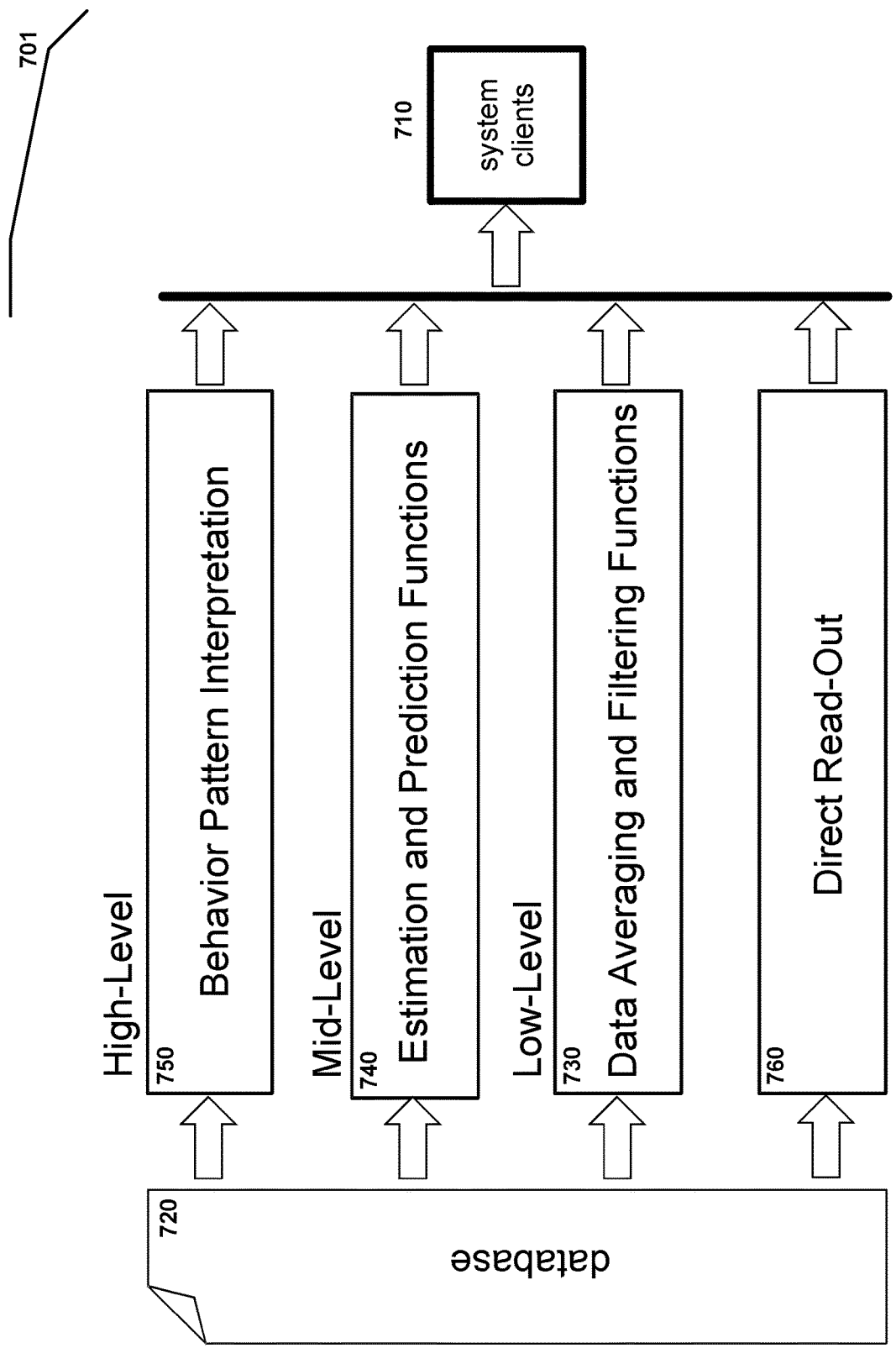
FIG. 7 shows processing functions and levels for processing contents of a spectrum usage database, with direct read-out capability.
Figure 8:
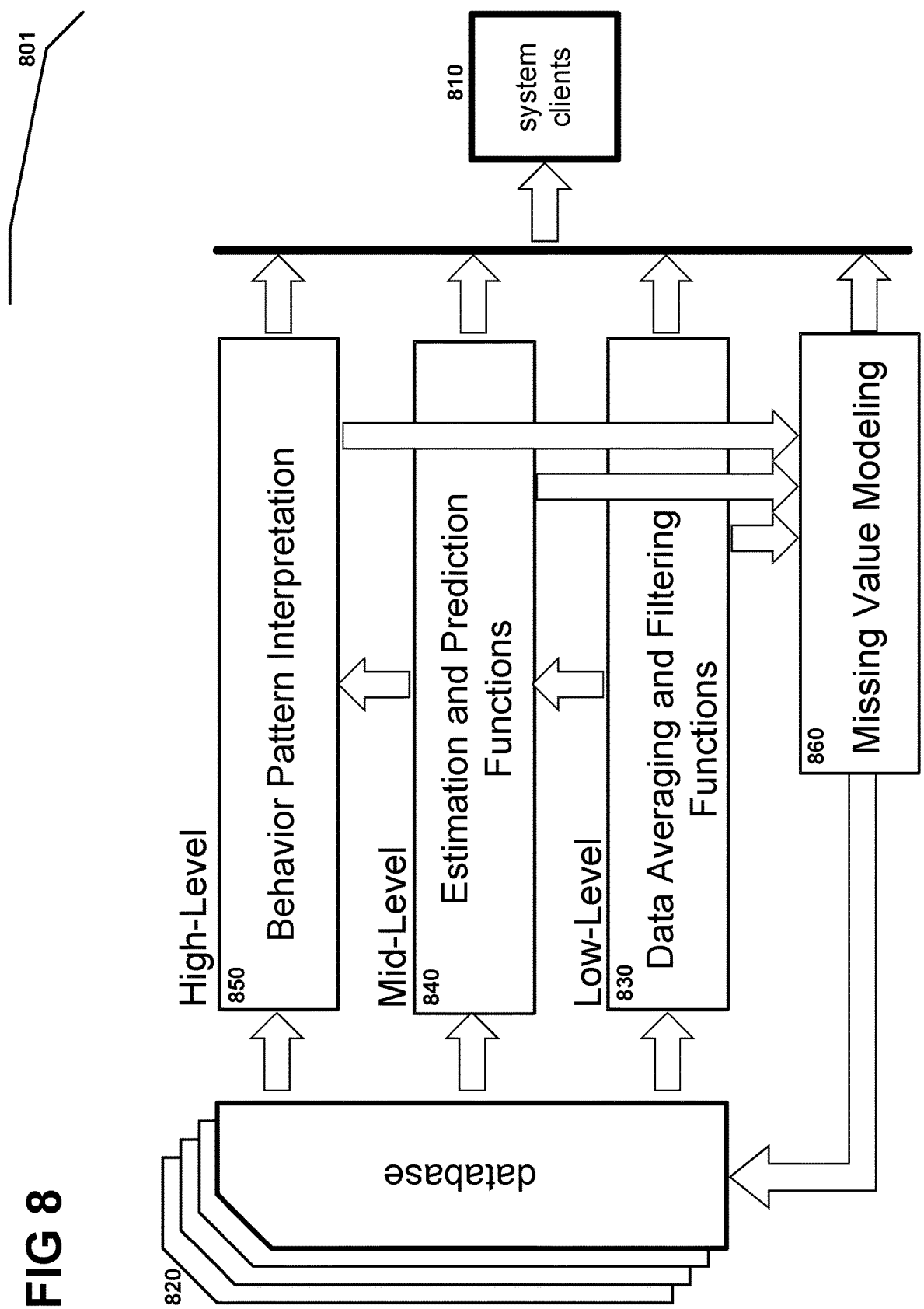
FIG. 8 shows processing functions and levels for processing contents of spectrum usage databases, with missing value modeling.
Figure 9A:
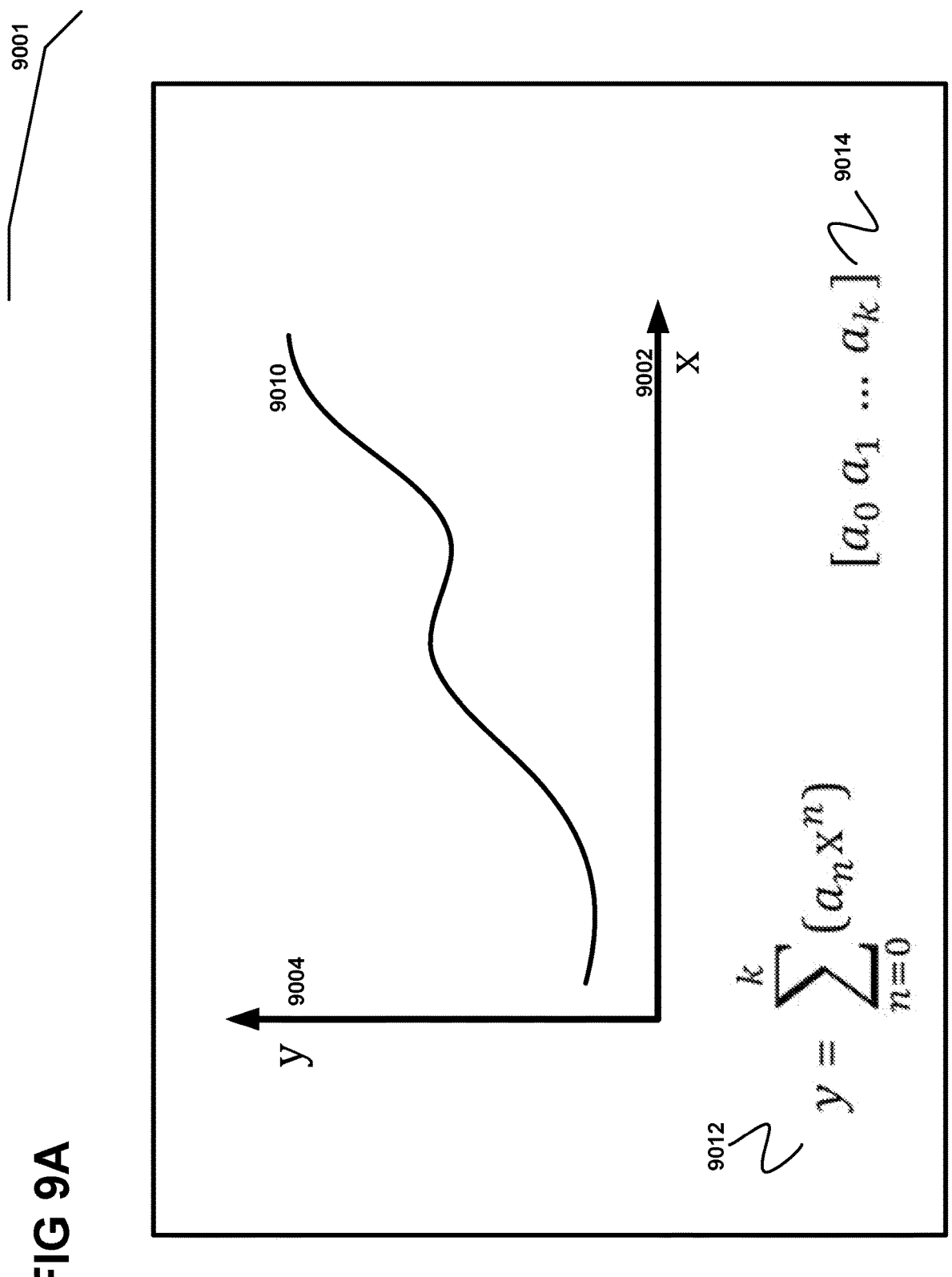
FIG. 9A shows an analytic model.
Figure 9B:
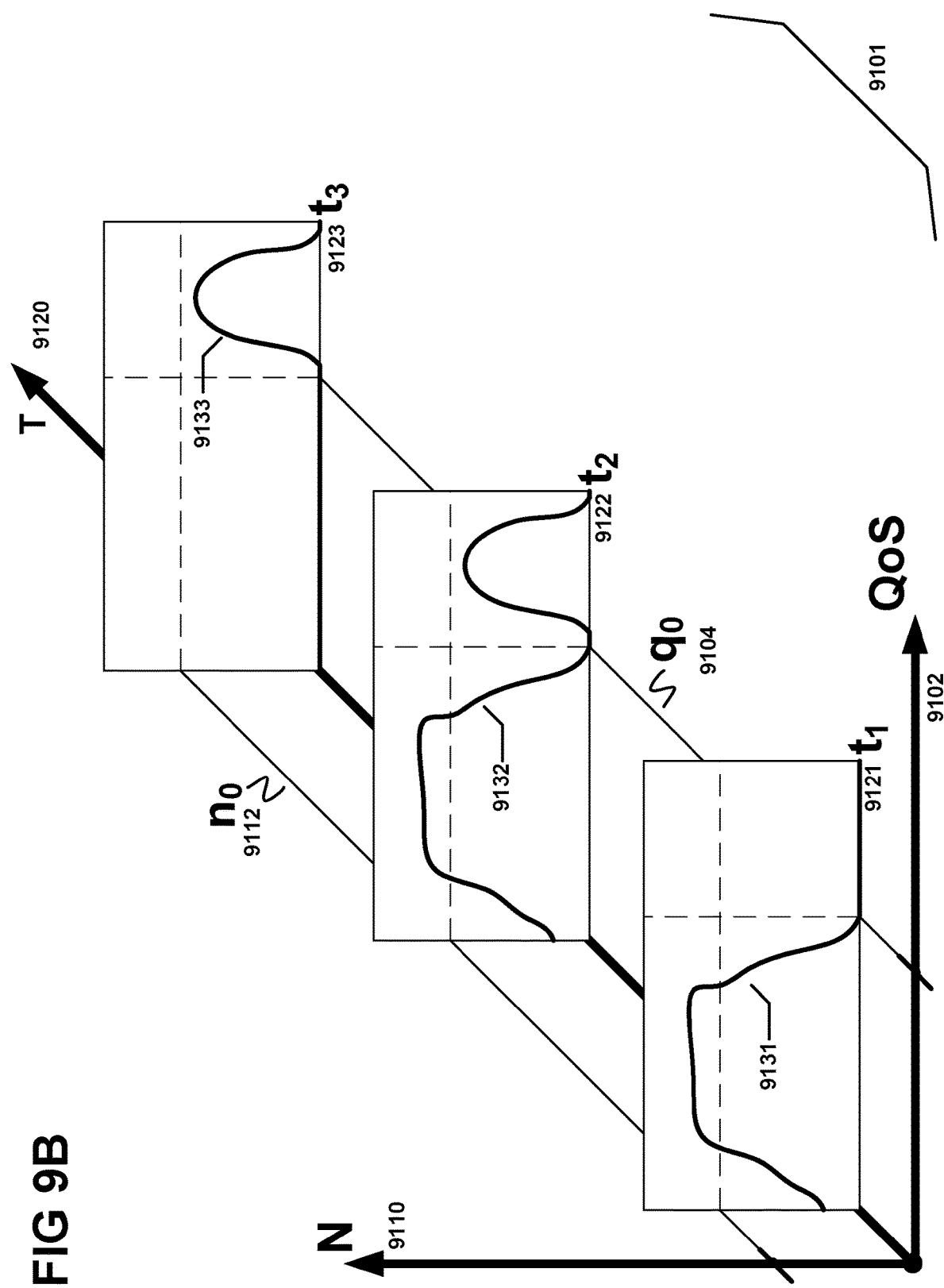
FIG. 9B shows a model.
Figure 9C:
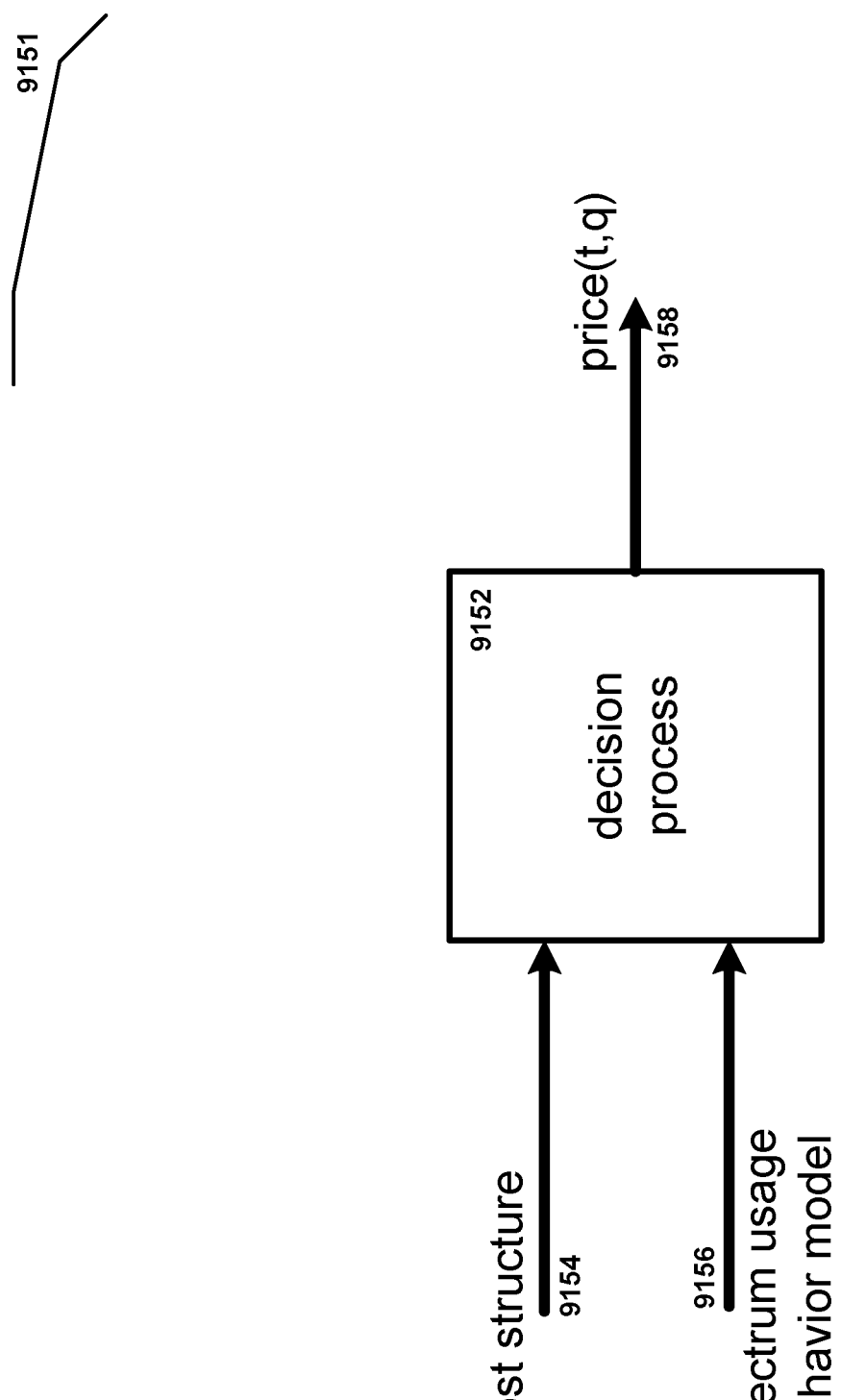
FIG. 9C shows price decision.
Figure 9D:
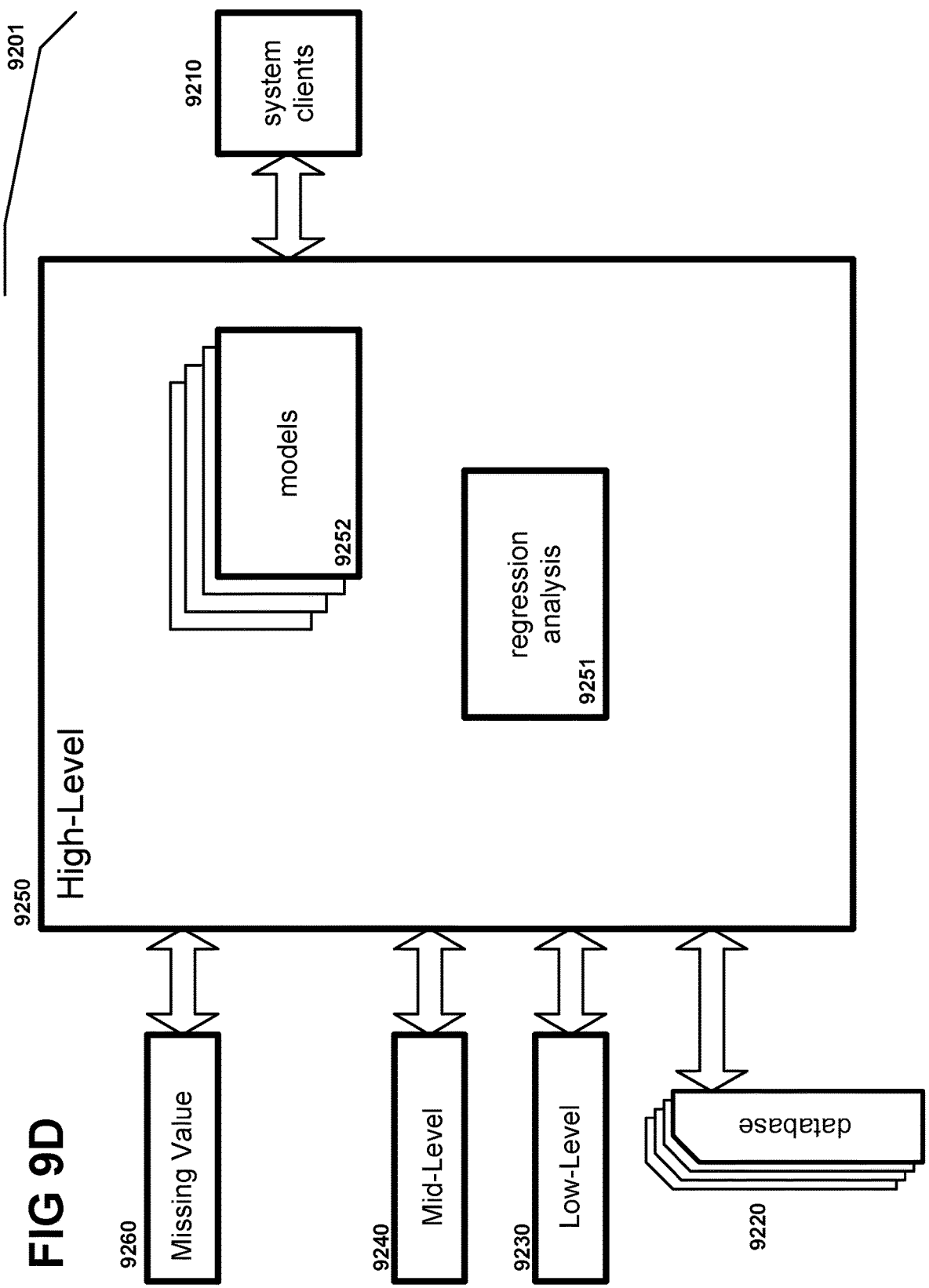
FIG. 9D shows high-level processing.
Figure 9F:
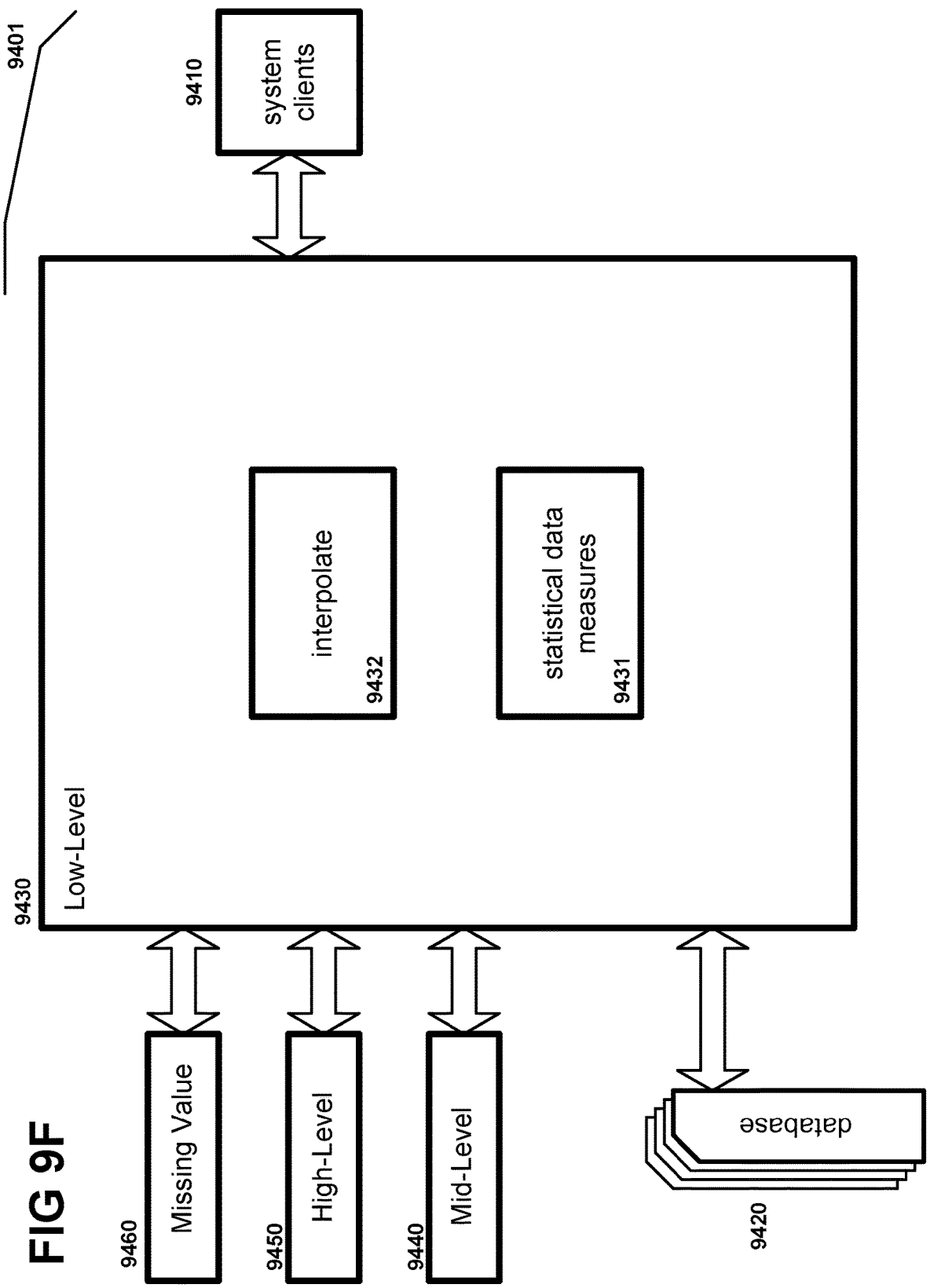
FIG. 9F shows low-level processing.
Figure 10:
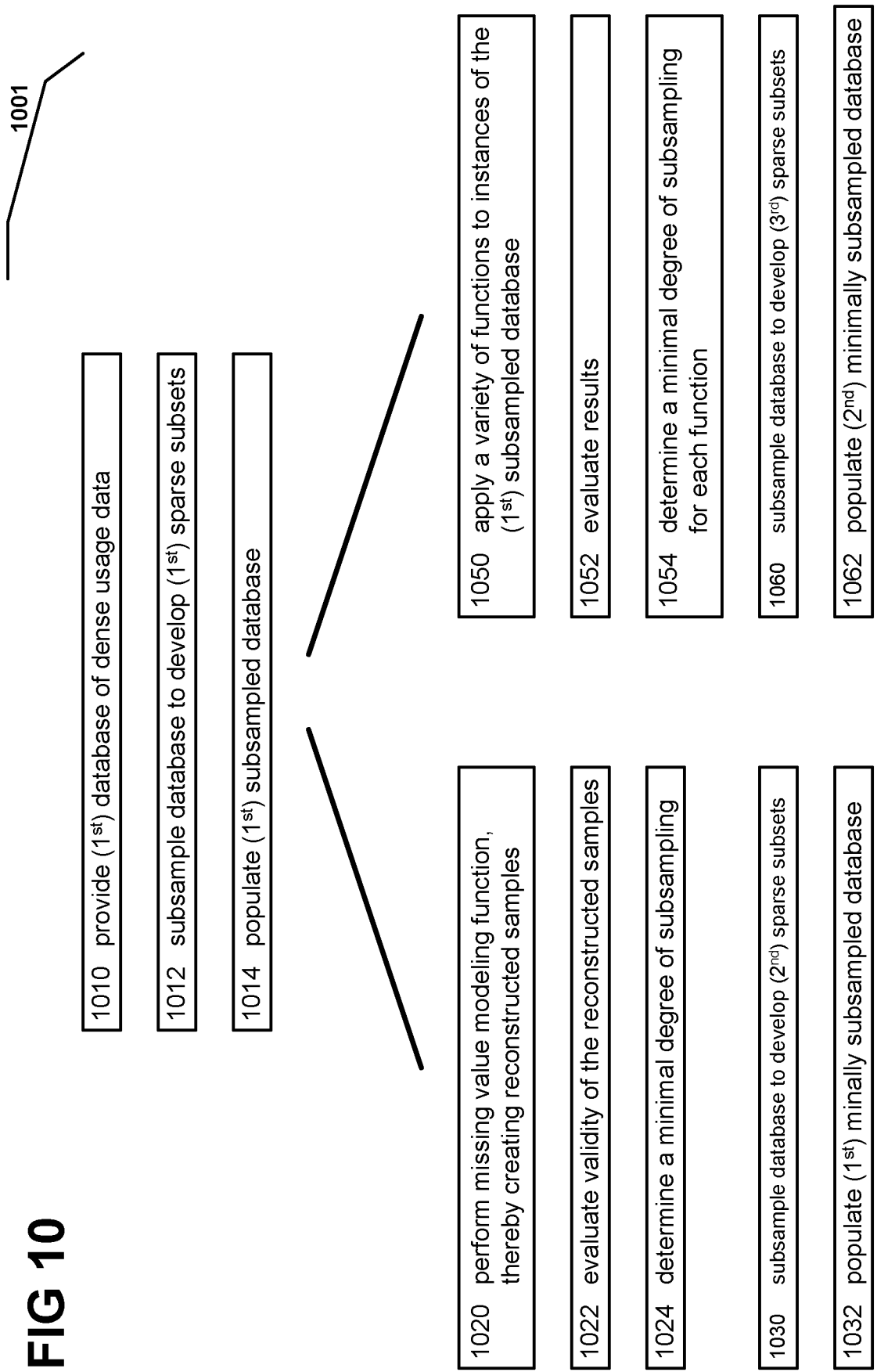
FIG. 10 shows techniques for optimizing sampling density.
Figure 11:
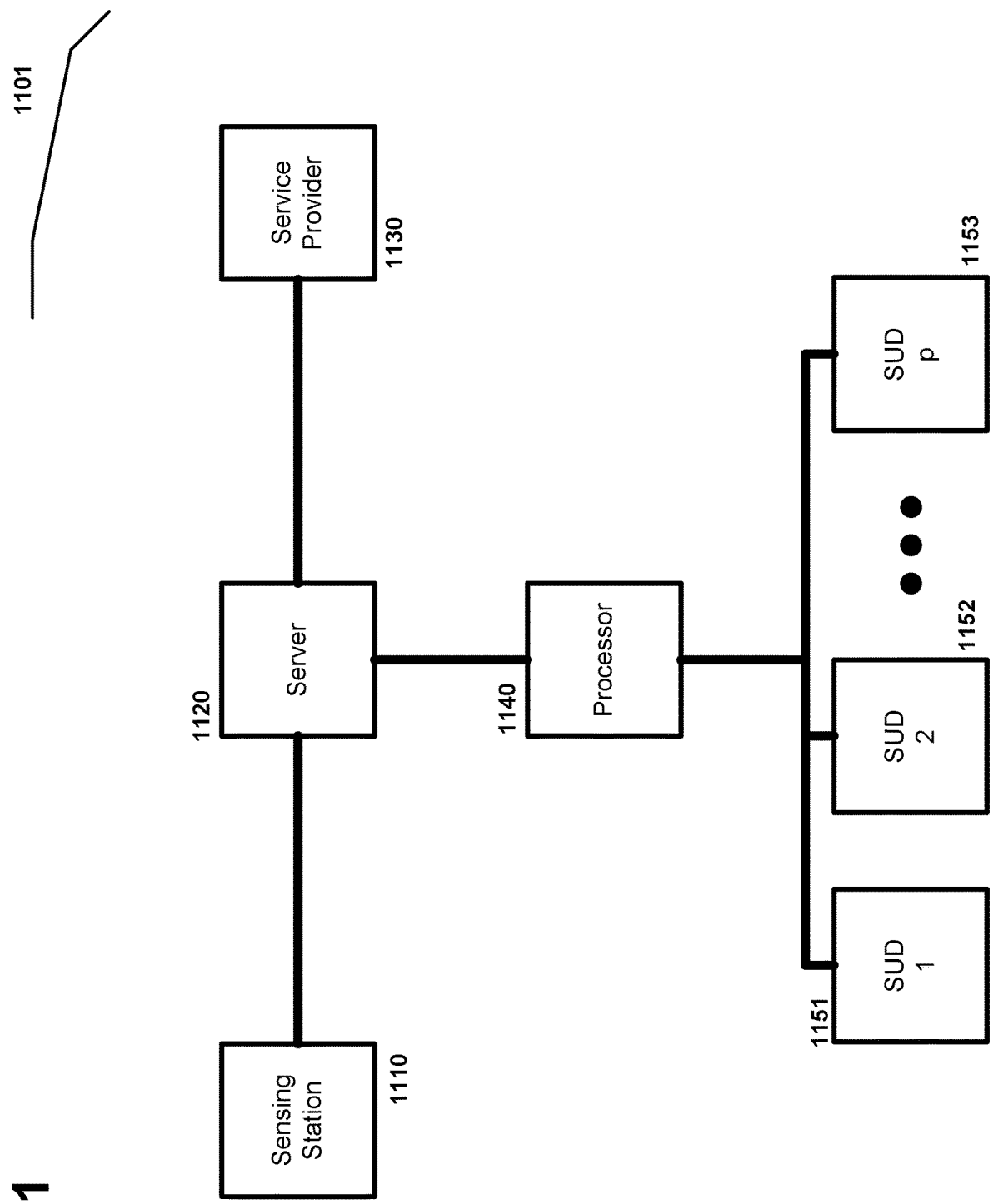
FIG. 11 shows a system embodiment.
Figure 12:
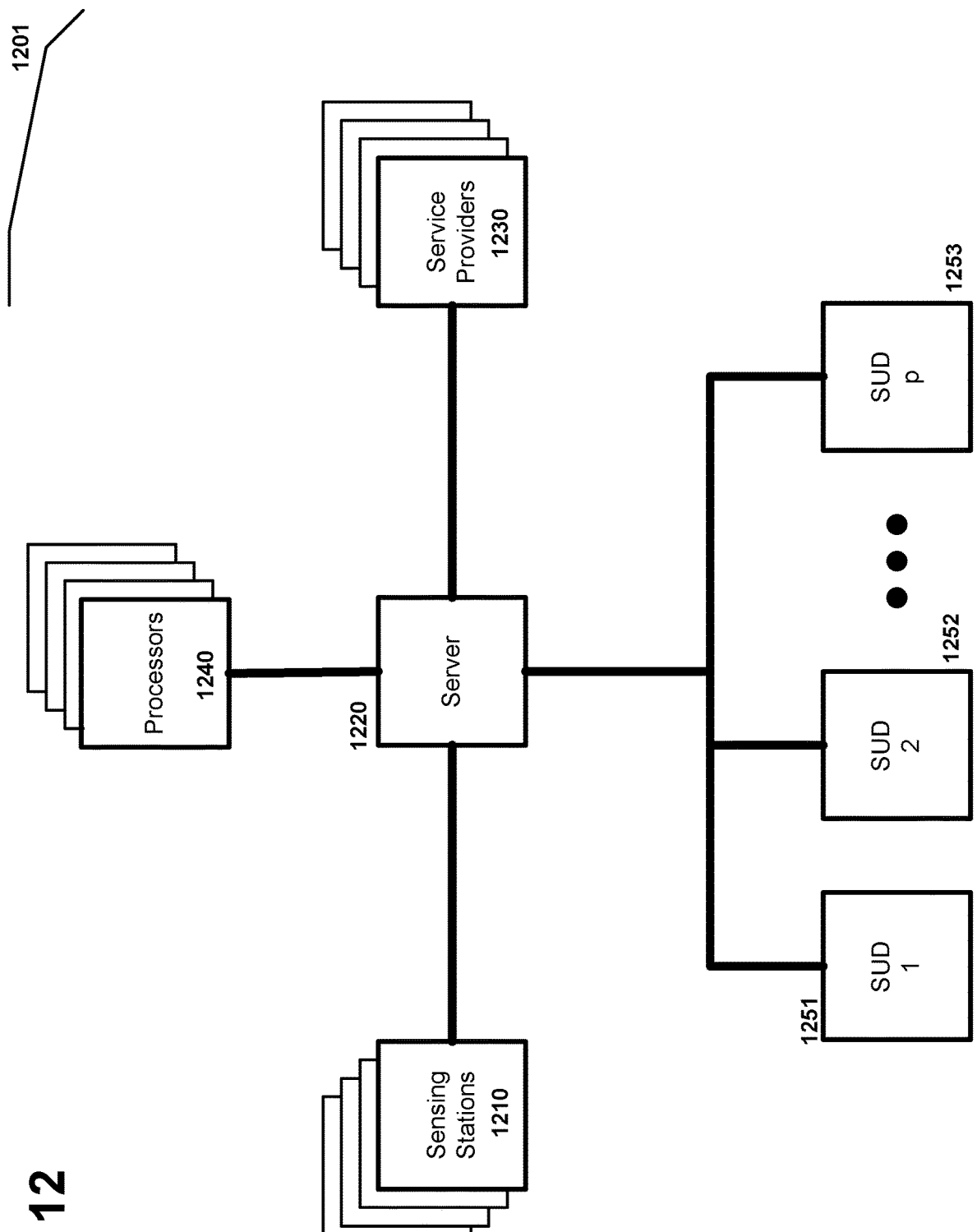
FIG. 12 shows a system embodiment.
Figure 13:
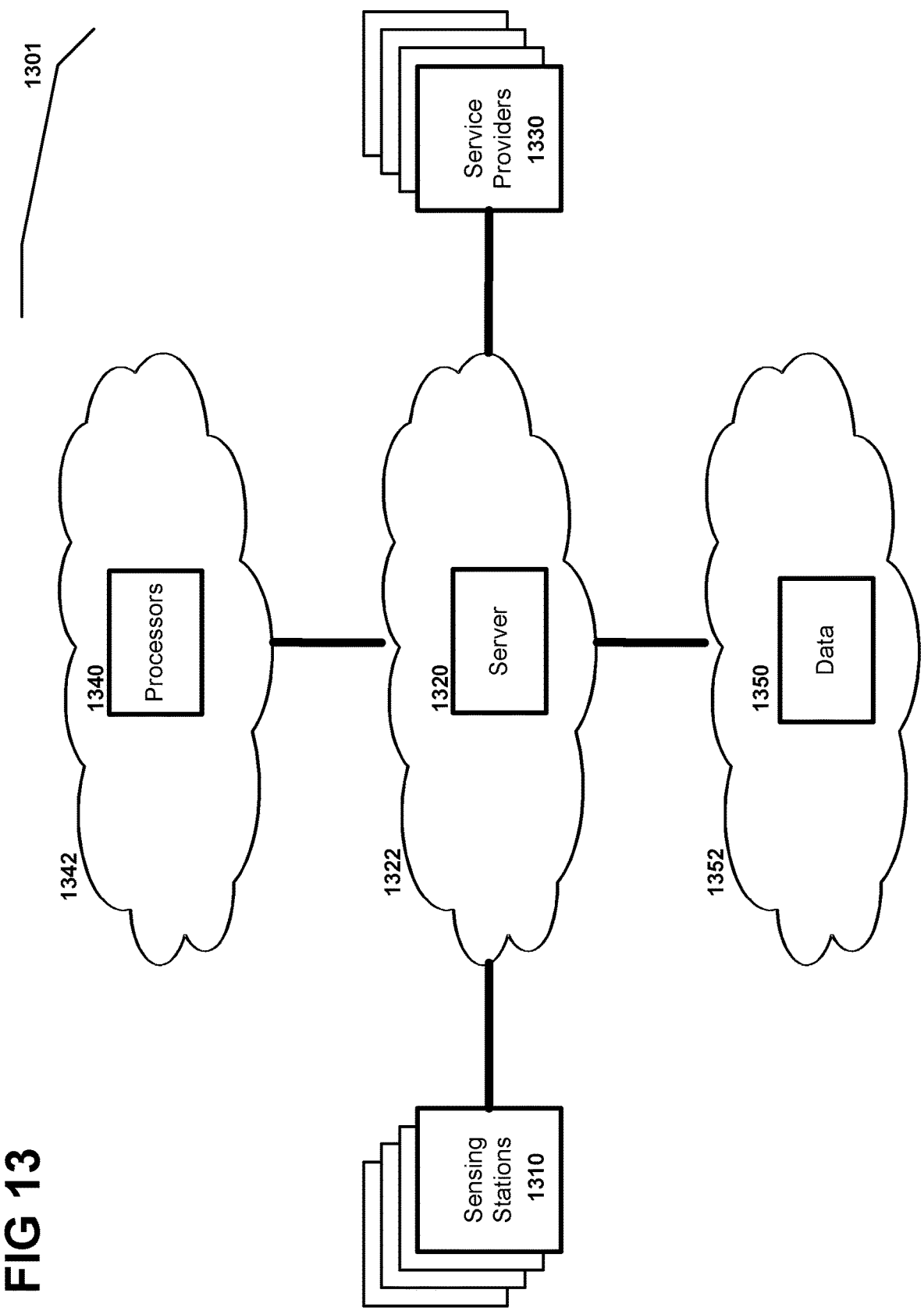
FIG. 13 shows a system embodiment.
Figure 14:
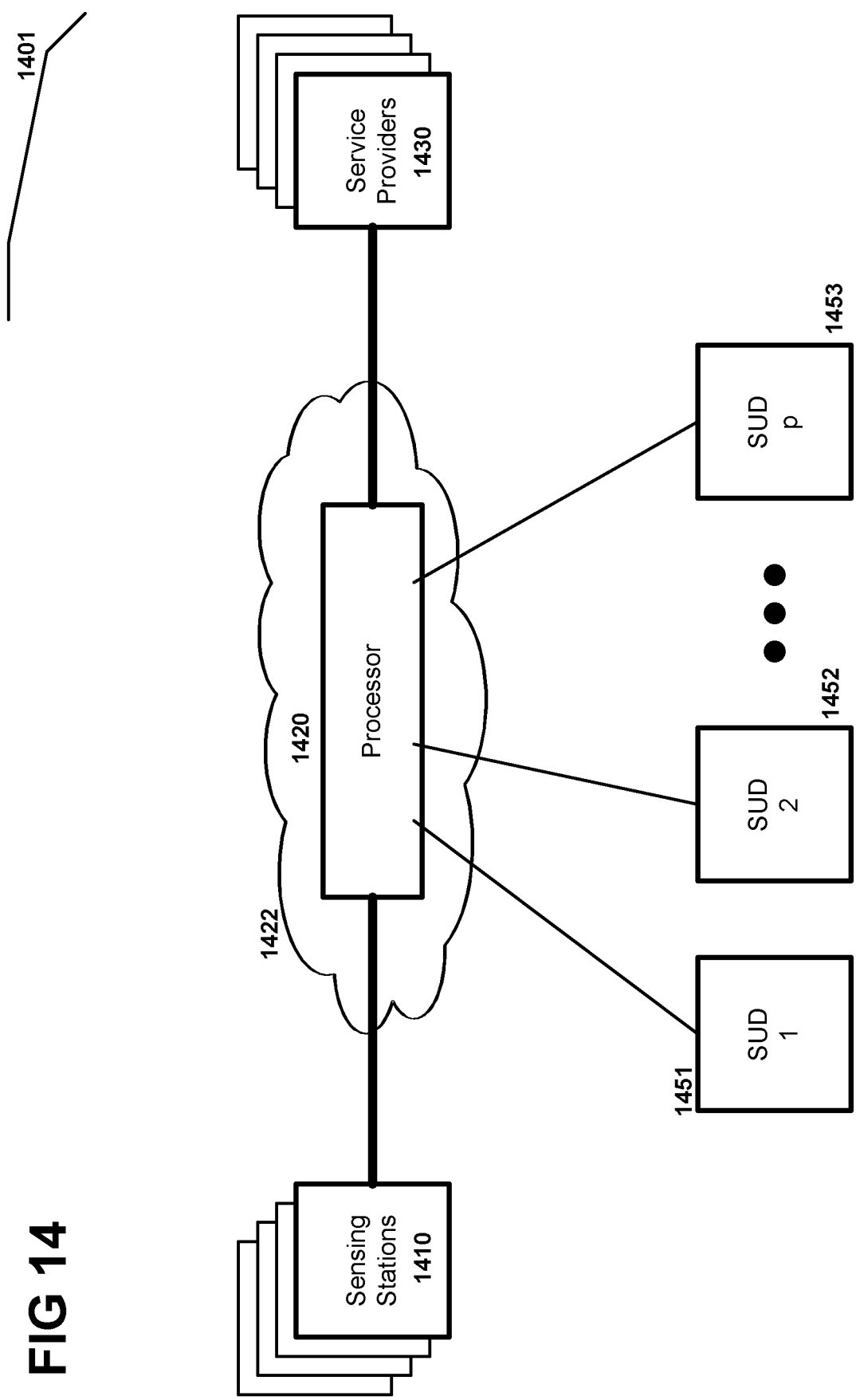
FIG. 14 shows a system embodiment
Figure 15:
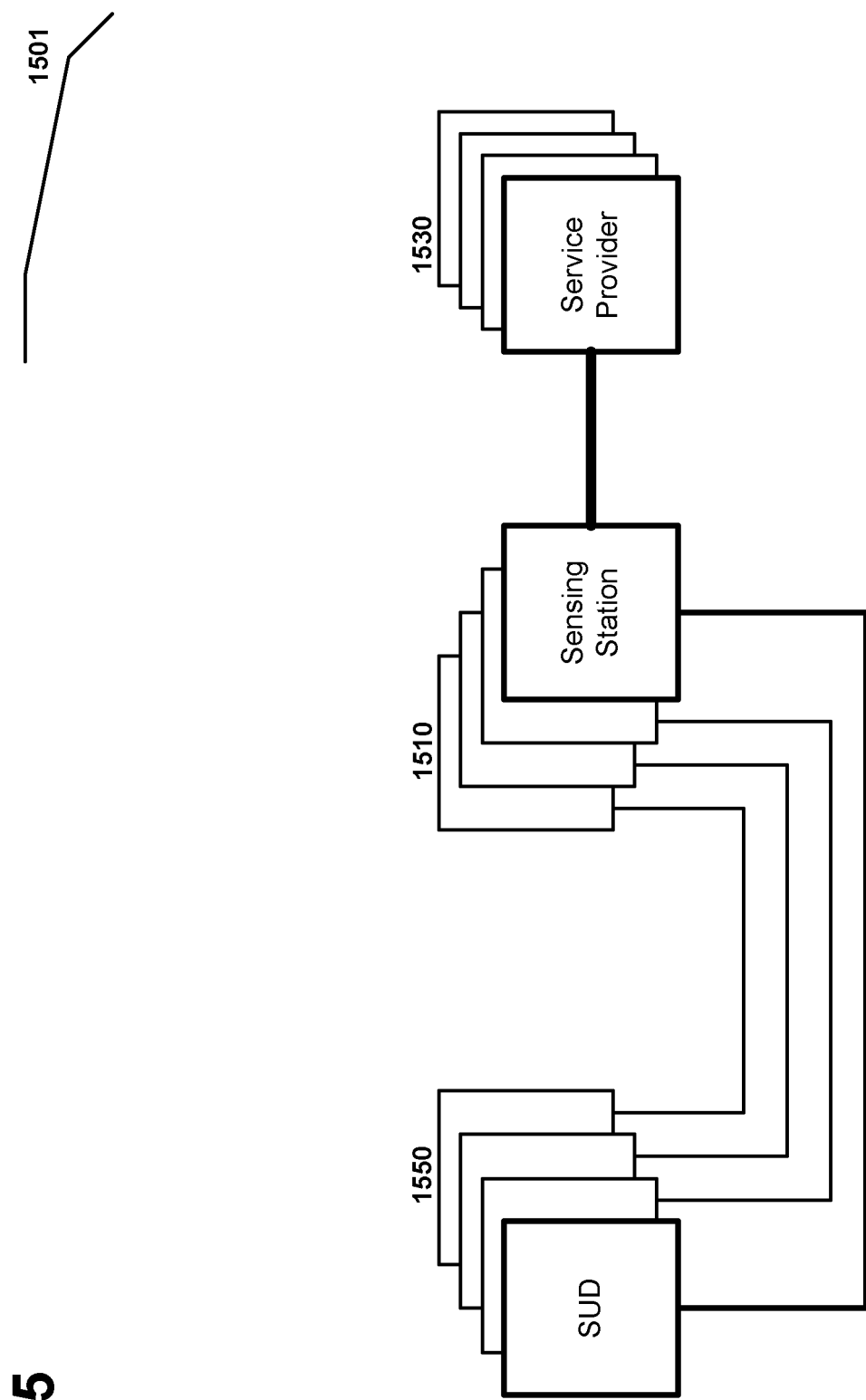
FIG. 15 shows a system embodiment.
Figure 16:
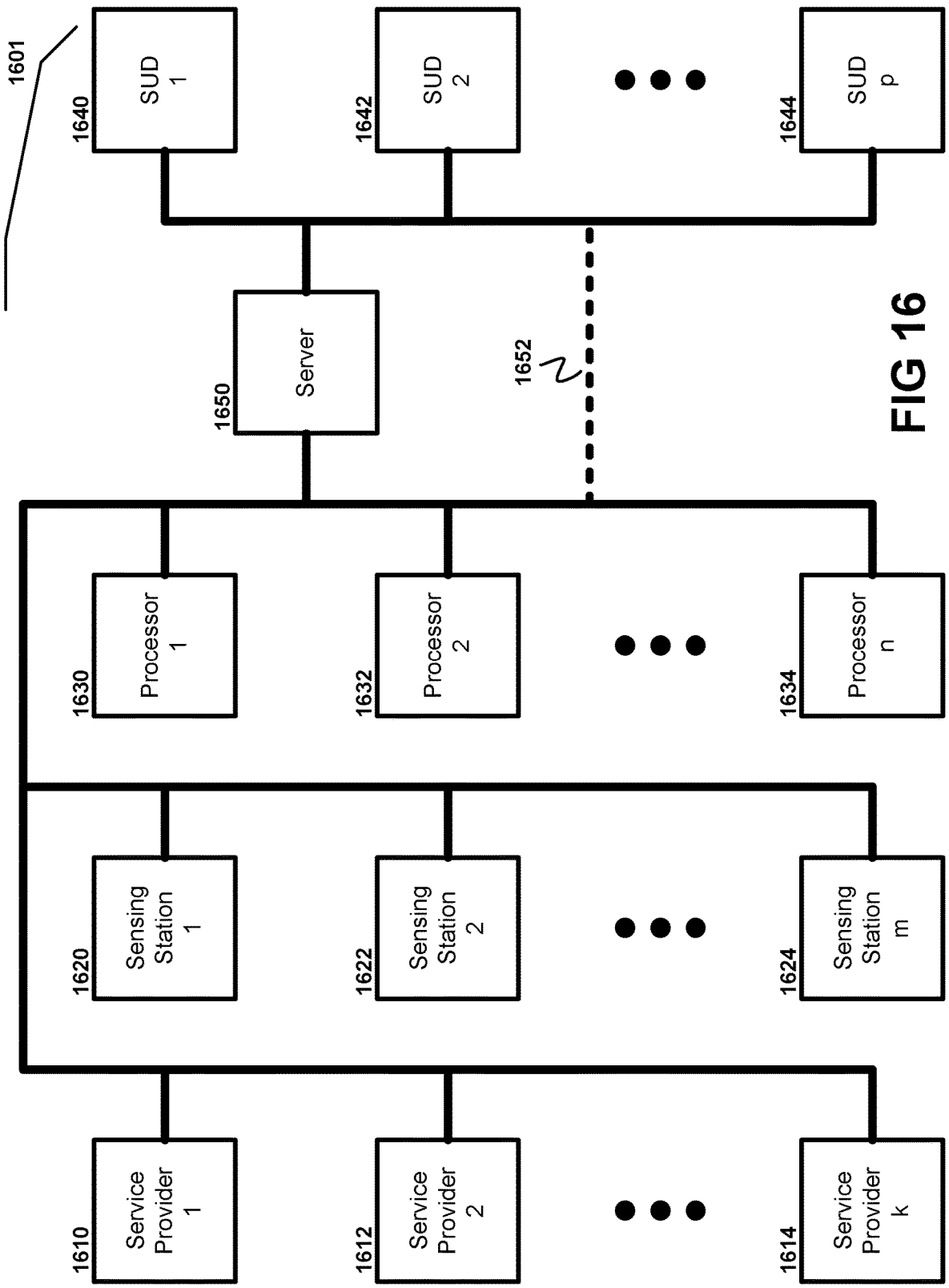
FIG. 16 shows a system embodiment.

Diagram 201 illustrates an embodiment comprising a plurality of Sensing Stations 210 and 220. Each Sensing Station can provide sensing capability for a corresponding specified geographic coverage area. In some embodiments, a Sensing Station can have local storage. Such storage can comprise a spectrum usage database (SUD). Sensing Stations can be coupled with each other, and can communicate with each other. The Sensing Stations can thereby share and/or exchange information between their respectively corresponding and locally-stored databases 212 and 222.

Diagram 301 illustrates an embodiment comprising a central server 302 that can collect, store, and share information between a plurality of Sensing Stations 310 and 320. In some embodiments the central server 302 can comprise control functions for one or more SUDs, with each SUD corresponding to a respective Sensing Station. Each Sensing Station can provide sensing capability for a respectively corresponding specified geographic coverage area. Each Sensing Station 310 and 320 can manage a respectively corresponding database 312 and 322 in a central server location. Communication between Sensing Stations and a central server can take place by means of a network and/or a network of networks, such as the "Internet" 330.

Heterogeneous Sampling:

In some embodiments a cognitive radio system can tune a radio frequency receiver to a target frequency range or channel, measure a corresponding energy level, and dwell for a time period adequate to input and process the received signal. A system can thereby determine a type of communication protocol being employed and various corresponding signaling parameters. Such a system can thereby provide a valid report on measured usage in a specified frequency range, for example, in a specified OFDM channel.

There can be a tradeoff between the sampling time interval granularity employed in visiting (dwelling) upon each of a plurality of channels, and the accuracy of the corresponding parameter measurement results. That is, accuracy of the parameter measurement results can typically be improved with increased time duration for monitoring a channel. Although accuracy of measured parameters for a channel can typically be improved directly by increased time duration of each "visit," such increased duration can cause a direct increase in overall temporal sampling periods, that is, a direct decrease in overall temporal sampling frequency. In some embodiments, as the duration of visits to individual channels increases, the sampling time interval between return visits to each channel also increases. Thus the accuracy of "in-channel" results can be improved at the expense of increasing the sampling time interval between visits to the/each channel, and that increased sampling time interval can lead to a decrease in temporal sampling accuracy.

In some embodiments, one or more techniques, described herein as heterogeneous sampling and monitoring, can be employed to advantageously minimize the impacts of a trade-off between accuracy of in-channel results and temporal sampling accuracy. A cognitive radio system can first perform one or more scans of the entire frequency range of interest, dwelling momentarily on each channel essentially only long enough to measure signaling energy that corresponds to the channel. Such per-channel measurements can each typically be performed more quickly than per-channel sensing operations that include determining signaling parameters. Thus a system can scan an entire frequency range relatively quickly, obtaining relatively dense sampling data over a range of interest. The system can subsequently interpret the measured information as directly related to the occupancy of the channels. The system can then selectively tune to channels on the basis of the channel occupancy so determined, and perform relatively slower signal acquisition in order to determine the details of usage, such as the signaling parameters, with adequate accuracy. Upon taking such measurements, the system can update a database record with one or more results of the measurements.

Diagram 401 depicts steps of an embodiment for performing heterogeneous sampling and monitoring, utilizing a system with sensing capability. In some embodiments, such a system can comprise a Sensing Station. By way of examples, steps for performing heterogeneous sampling and/or monitoring can include one or more of the depicted operations:

410 For each specified channel within a specified spectral range:
    412 tune a system to a specified channel, and,
    414 perform relatively rapid measurement for that channel, wherein the relatively rapid measurements can comprise measuring signal energy for that channel,
    416 thereby providing corresponding measurement information about that channel;
420 For one or more of the specified channels:
    422 interpret the corresponding measurement information, thereby determining measures of channel occupancy for at least some of the specified channels;
    424 identify channels of interest for further processing, based on the determined measures of channel occupancy;
440 For one or more of the identified channels of interest:
    442 selectively tune the system to an identified channel of interest;
    444 perform additional measurements for the identified channel of interest;
    446 determine measures of channel usage for the identified channel of interest, based on the additional measurements.
    448 update a database record, responsive to at least one of the determined measures of channel usage.

In some embodiments, parameters (parameterized elements) can be sensed locally by Sensing Stations and/or obtained and/or determined from and/or by other sources. A database can comprise storage capacity and/or instantiations of one or more parameterized elements corresponding to a specified channel. In some embodiments, such parameterized elements can comprise one or more database records. Diagram 501 depicts an embodiment having a plurality of database records 510, 512, and 514 within a database 550. A database record can comprise one or more of the following:

time 520, such as a timestamp according to a global and/or local time reference, corresponding to a sample;
energy level 521;
Signal to Noise Plus Interference Ratio (SNIR) 522. For example, SNIR levels in 'occupied' channels;
Identification of a signaling scheme 523;
a number of users 524 accessing and/or occupying the specified channel; that is, a count of the number of users
one or more of license owner(s), secondary license owner(s), shared license information, unlicensed use status 525
price structure for secondary license use (of the specified channel) 526

Modeling:

A database of usage samples obtained and/or determined by these and/or any other known and/or convenient techniques can comprise measured usage data for specified sampling instances and/or for a plurality of sampled frequency channels. By way of example, parameterized elements in an exemplary database can correspond to each of a plurality of specified OFDM channels in an OFDM based communication signaling protocol.

Entries and/or records in a database can be regarded as sample sets obtained across dimensions of time, space, and frequency. Such sample sets can (each) have granularities and sampling densities that vary in response to choice of sorting dimension, that is, in response to specified sorting criteria.

Temporal Samples:

In some embodiments, a complete scan of a spectral range comprising a plurality of channels (frequencies, frequency bands) of interest performed with a single cognitive radio device can require a significant length of time. Thus, entries in a corresponding database can correspond to notably different sampling times (timestamps) between measured channels. Heterogeneous sampling (scanning) techniques as herein described can reduce this effect to some extent, for samples that are based on relatively rapid scanning of energy levels. That is, a time(stamp) difference between samples of different channels can be somewhat minimized by employing such techniques. However, in some embodiments wherein a system processes the content of a received signal to determine corresponding signaling parameters, samples of different channels can remain notably separated from each other in the temporal domain.

Spatial Samples:

The quantity and separation of cognitive radio systems, such as Sensing Stations, that cover a specified geographic region can be a function of many factors. These factors can comprise dependencies upon hardware, installation costs, and/or the location of existing towers. Thus in some embodiments, a spatial sampling regime may not nominally achieve an ideal and/or desired density.

Frequency Samples:

In some embodiments, specified samples along the spectral (also known as frequency or channel) dimension may be missing or intentionally skipped over in order to more rapidly perform a scanning campaign in the frequency domain. In some embodiments, a cognitive radio system can increase a sampling interval along the frequency axis in order to achieve a faster sampling time. For example, a system may skip tuning to one or more OFDM channels when sequentially scanning channels in a specified band, and/or skip some other channels in subsequent scans.

Diagram 601 depicts examples of sampling that can correspond to entries in an embodiment of a SUD. In the diagram 601, each disc indicates a possible instance of sampling data for a specified time, channel, and location. Discrete coordinates of such an instance are depicted along a time axis 602, a channel axis 604, and a location axis 606. A filled disc 608 indicates the presence of measured and/or derived data for an instance at the depicted coordinates. An empty disc 610 indicates the absence of such data.

Diagram 601 depicts the discrete coordinates along both time 602 and channel 604 axes as regularly spaced. However, the discrete coordinate value(s) along any of the axes 602, 604, and 606 can be regularly and/or irregularly spaced, in some embodiments. For example, the four groups of sample coordinates 612, 614, 616, and 618 are depicted as irregularly spaced along the location axis 606.

Location is depicted along a single dimension for the purposes of diagram 601. However, in some embodiments, the coordinates for a location can comprise a plurality of dimensions. Channel is depicted along a single dimension for the purposes of diagram 601. In some embodiments, a channel coordinate can correspond to a designated span along a single frequency axis. In some embodiments, the coordinates for a channel can comprise a plurality of factors. Such factors can be described as a plurality of dimensions.

Sample coordinates grouped in two dimensions (time, channel) for specific locations are shown. Group 612 illustrates the presence of (meaningful) data at all the discrete time and channel coordinates shown for a first location. Group 614 illustrates the absence of (meaningful) data at all the discrete time and channel coordinates shown for a second location. Group 616 illustrates a mix of present and absent samples at a third location. Group 618 illustrates samples absent for all time values for a specific channel, and samples absent for all channel values for a specific time, at a fourth location.

A modeling approach can address many aspects of a database creation and maintenance operation.

(Modeling) 1. Long-Term Behavior Model

A database 720, such as a SUD, can be populated by means of sampling measures of channel occupancy and usage across frequencies of interest, and over a time span. This populated database can be used to develop models for behavior of communication activities in a specified geographic area. Such modeling can be performed at a variety of levels. The levels can comprise low-level data averaging and filtering 730, mid-level estimation and prediction functions 740, and/or high-level interpretation of underlying usage patterns 750. Functions performed in these layers are described below and illustrated in diagrams 701 and 801. Functions implemented in each of the levels can be applied to database entries directly and/or to results that can be obtained from lower-level operations upon database entries.

Diagram 701 illustrates processing functions and levels for processing contents of spectrum usage databases, including a direct read-out capability 760. Results can be provided for system clients 710, such as system operators and planners.

(Modeling) 1.A. Low-level Functions

Data processing functions such as averaging and filtering can be applied in order to extract specified statistical data from a database, such as a SUD, about occupancy in a specific frequency range and over a specific time span. In some embodiments this can be performed through a query mechanism. In some embodiments, a SUD can comprise data corresponding to one or more geographic areas, such as coverage areas. The query mechanism can access and obtain database entries from the database that are relevant to specified target frequency and time samples. The entries can subsequently be employed by filtering functions. The filtering functions can extract average values and measures of variation, from the queried data. For example, the following statistics can be obtained through the use of filtering functions applied to various types of queries:

Average and maximum number of users during a specific time interval during the day over the past month;

Average number of OFDM channels allocated to users who requested a specified quality of service (QoS) requirement over a certain range of time;

Average duration a licensed channel was available for secondary license use in a specified day of the week over the past three months;

Average and maximum price paid for running a specified communication session at a specific time of day during the past week;

Worst case interference levels and duration of network outage due to congestion in a specific time window of the day over the past month;

The average and maximum price a particular user has paid for a specified QoS over the past six months.

QoS, also known as "quality of service," can comprise one or more parameterized service quality measures. In some embodiments, such service quality measures can comprise one or more of those described in ITU-T Recommendation E.800 "TERMS AND DEFINITIONS RELATED TO QUALITY OF SERVICE AND NETWORK PERFORMANCE INCLUDING DEPENDABILITY" (1994). In some embodiments such service quality measures can comprise any other known and/or convenient quality measures. By way of examples and not limitation, in some embodiments such service quality measures can comprise one or more of the following:

throughput relative to user cost (value);
priority of a specified session relative to other sessions;
reliability; and/or,
qualitative and/or quantitative aspects of a user experience.
For some embodiments, throughput can be understood as an average rate of successful message delivery over a communication channel.

A list of possible statistics that can be extracted from a database through sampling and filtering functions can be quite large and diverse. Hence, low-level functions can serve to provide a large and/or heterogeneous collection of statistical data that can be based upon specific interests of system clients. System clients can comprise system operators and/or planners. Such functions can also provide mechanisms for planning usage, and for setting usage prices dynamically at least partially in response to historical data.

Averaging and filtering functions can also be applied to combinations of databases. For example, statistical values can be obtained and/or derived for a specified geographic area that comprises aggregated areas corresponding to combinations of databases.

(Modeling) 1.B. Mid-Level Functions

Data entries obtained from a database as a result of queries can be employed in estimation and prediction functions. Estimation and prediction functions can provide information derived from available usage data for frequency and/or time samples that lack measurement entries or meaningful measurement entries. Estimation functions employed at this level can provide values for usage data which may not be directly equivalent to a database entry. Such values can instead be the result of combining some database entries or averages and/or other statistical values that can be obtained via low-level functions.

For example, in some embodiments, the following parameters can be estimated:

An estimated number of OFDM channels in a specified licensed band that are expected to become available at a desired time window;
An expected price that an adequate number of users are willing to pay, for a specified QoS level at a specified time of day;
An expected time window in an upcoming day in which high network congestion may justify procurement of new secondary license capacity at a specified price, in order to support an expected number of users.

In some embodiments such estimated parameters can correspond to one or more specified geographic areas, such as coverage areas.

A list of useful and/or tractable estimation or prediction targets can be large and diverse. Elements of such a list can be responsive to scope of operation for specific systems. Elements of the list can also be responsive to flexibility that can be provided by system owners and/or operators in scaling service capacity, and/or in dynamically adjusting parameterized options.

(Modeling) 1.C. High-Level Functions

Interpretations of long-term patterns of usage, pricing, and other behavioral elements can be made based on database contents. Categories of modeling outcome that can result from high-level functions comprise:

(Modeling) 1.C.i. Usage Behavior

High-level modeling functions can employ some or all of entries in a database. Entries in a database can comprise a set of initial measurements and/or samples reconstructed through the use of matrix completion techniques. A descriptive model for a database can be developed. Such a descriptive model can contain fewer dimensions than the full dimensionality of the entries in the database.

For many practical queries, while a large number of system parameters may theoretically bear upon an ideal optimization of a specific decision, in some embodiments a sub-optimal decision can serve a specific case just as well. That is, a sub-optimal decision can be based on optimizing with respect to fewer than all of the available system parameters. In some embodiments, such a sub-optimal decision can provide a minimum loss of performance and added efficiency and/or agility in decision making, in a dynamically changing environment. In such situations, it can be beneficial to develop reduced-order models for representing the dynamics of a database across various parameter and/or performance dimensions. For example, the following scenario can be the outcome of such a modeling effort:

The price of obtaining a secondary license in a specified geographic region typically varies based on the number of interested users and their combined QoS requirements.
A model may reveal that at certain times of day the actual number of users and/or their requested QoS may not be relevant factors in determining an optimal price.
Hence, such a model can inform a fixed-price model for the specified time window. In some embodiments such a model can inform an answer to the question "What time of day is best (optimal) for a specific service provider to invoke a flat rate pricing structure?"
Diagram 9101 illustrates an embodiment of the scenario, and is described in greater detail below.
Analysis provided by these functions can reveal redundancy and/or low impact of certain system parameters on overall efficiency of a system operation. In some embodiments, removing and/or reducing queries that involve such parameters can improve system performance, and can also be used to prune and/or filter entries of the database. This can also lead to better design of a sampling campaign for incrementing a database.

In some embodiments a behavior model can be based on the contents of a combination of databases, wherein each constituent database can be associated with a respectively corresponding geographic area. Such cross-modeling can provide behavior patterns for a geographic area larger than and/or encompassing sensing coverage areas of participating Sensing Stations. Such a behavior model can provide estimates for usage for areas between those coverage areas corresponding to participating Sensing Stations, and/or yield estimates for other specified locations based on interpolation and/or other estimation techniques. Diagram 101 illustrates an area 140 between coverage areas 110, 120, and 130 respectively corresponding to Sensing Stations 112, 122, and 132.

(Modeling) 1.C.ii. Operation Planning

In some embodiments, planning for operation of services such as network communication services can employ usage behavior models and/or database content. Planning can be for services that can operate in one or more layers of communication systems operation. In some embodiments, database content can comprise data collected over a relatively long period of time, such as weeks or months. In some embodiments, the layers can be as described in a well-known Open Systems Interconnect (OSI) model. The layers can comprise a physical layer (PRY) and/or a network layer and/or other known and/or convenient layers. Layers can comprise sublayers. By way of example and not limitation, a Media Access Control layer (MAC) can be a sublayer of a data link layer.

In some embodiments, plans for operation of services can be based on the above described behavior models and/or additional models. In some embodiments, plans for operation of services can be based on rules that define parameters and/or decisions that can affect various aspects of a communications system.

In some embodiments, a system can be tuned to a particular frequency or channel, and such tuning can vary over time. As the tuning varies, processing delays and/or other system overhead can be responsive to specified system parameters and/or completion of some current tasks in a PRY layer and/or other layers.

In planning for agility of a frequency band choice over time, tolerance constraints for such delays and/or overheads can be considered. An example of planning based on database content modeling is described herein:

An optimization according to a specified set of constraints can be for a multi-user service to assign each user a specified number of OFDM channels, wherein a system thereby processes each user's corresponding communication link in parallel. A model may determine a specified congestion level at which more effective utilization of spectrum and/or system resources and/or other advantageous results can be obtained from assigning essentially all available OFDM channels to each user, sequentially. Thus processing for each user can take place sequentially rather than in parallel. In some embodiments, such an assignment regimen can lower overhead burdens. A model may be capable of taking into account historical data in determining a selection between the sequential and parallel processing options of this scenario, according to a specified efficiency constraint.

Such a modeling effort can address a variety of aspects of network operation. In some embodiments, the results of modeling can be employed to address developing a pricing structure based on historical usage patterns. Historical usage patterns can comprise throughput, patterns of network congestion, patterns of delivered QoS, and/or (historical) data for service pricing.

In some embodiments, a behavior model can be developed that employs a plurality of databases, wherein each database corresponds to a specified geographic area such as a coverage area. Such behavior models can be used to advantageously plan deployment of communication networks.

In some embodiments, communication networks can comprise one or more of cellular phone and/or data networks, wireless local area networks such as Wi-Fi and/or other IEEE 802.11 based networks, WiMAX networks, and/or cognitive radio systems.

Communication networks can provide user services, and can comprise base stations, relays, access points, and user devices. Such deployment can comprise relocation of extant systems and/or introduction and arrangement of new systems. In some cases, such deployment can provide improvements to service coverage. In some embodiments, channel selection can be determined in response to coordination between base stations that serve neighboring geographic areas. Such channel selection can result in improved utilization of available spectrum resources.

In some embodiments, Sensing Stations can be deployed and/or arranged in response to behavior models, and/or in coordination with deployment of communication networks. In some embodiments, a behavior model can advantageously contribute to effective management for spectrum resource utilization by, and/or communication services for, mobile users who can move between coverage areas. Such movement can comprise specific users entering and exiting specific coverage areas.

(Modeling) 1.D. Data Flow and Feedback

Diagram 801 illustrates processing functions and levels for processing contents of one or more spectrum usage databases 820. Some embodiments can include a missing value modeling functionality 860, and feedback between functional levels 830, 840, and 850. Results can be provided for system clients 810, such as system operators and planners.

In some embodiments, feedback between functional levels can be employed in updating a database. Database entries can be employed by each of the described functional levels and can be used for extracting specified query reports. In addition, exchange of outputs between functional levels can enhance results in various ways. For example, in addition to running a prediction function on a set of database entries corresponding to 'raw' measurement results, such a prediction function can be applied to results of averaging and/or filtering functions and/or employ results of a missing value modeling function. Employing the results of functions of one processing level can enhance efficiency for other functions of the same and/or other processing levels. In some embodiments, enhanced efficiency can be obtained through reducing the size of input data, and/or reducing effects of noise and/or outlier values by employing filtering, averaging, and/or estimation operations.

(Modeling) 2. Missing Value Modeling

Temporally listed database entries can contain missing values. In some embodiments, samples corresponding to a specific time and/or time-span can be significantly sparse with respect to channels within a spectrum region of interest. This temporal sparseness across channels can result from the dynamic behavior of a Sensing Station as it dwells sequentially upon each of a plurality of channels. In some embodiments, a skipping scheme can be employed to scan a specified frequency range. Sparse frequency and/or channel sampling of specified frequencies and/or channels can result from such a scheme.

Hence, for a database comprising values obtained essentially from making measurements at a specific geographic location, the values corresponding to many data samples can be essentially missing in a nominal sampling grid. It can be advantageous to employ derived values for such data samples. In some embodiments, relatively simple averaging and/or filtering techniques can be employed to interpolate and/or fill-in some or all missing entries. However, such relatively simple techniques may not fully make use of the underlying structure of the data. Relatively new signal processing techniques, such as compressive sensing and/or missing value imputation, can in some cases make fuller use of underlying structure of the data. Such techniques can be employed to derive and populate samples in a database along dimensions of time and/or frequency and/or location.

Thus a database can have an increased quantity of its samples (entries) populated with useful values and which can be employed to serve queries. These entries can correspond to samples for which there were previously no direct measurements, due for example to sampling time sparsity and/or skipped frequency channels.

Additionally, when a plurality of databases are available, each corresponding to cognitive radio systems that scan neighboring regions, similar signal processing techniques can be employed to determine usage patterns in missing time and/or frequency samples, and/or for geographic regions in proximity of the sampled regions. These techniques can employ a plurality of databases, in an embodiment wherein a plurality of systems each provide and/or populate samples (entries) in a respectively corresponding database.

Application of techniques such as matrix completion and/or missing value imputation techniques to a database can result in replacing some missing samples by estimates. In some embodiments, these estimates can be extracted through querying the database. These values can be estimated based on samples available from the database in combination with a behavior model. Such a behavior model can be developed over time for a system. Operation of behavior models is further described in "1.C. High-level Functions" section set forth herein. In some embodiments entries in a database can be employed in order to fill in corresponding missing values in a database associated with a neighboring area. In some embodiments, specific functions can be employed to mutually solve for missing values in more than one database.

Diagram 9001 illustrates features of a model that in some embodiments can be used for modeling aspects of spectrum usage corresponding to a SUD. A dependent variable y 9004 can be characterized as a function of one or more independent variables such as x 9002. An example functional relationship over a range of x is illustrated by the curve 9010. In this example, a model comprises a polynomial of x of degree k, expressed by the equation (9012)

$$y = \sum_{n=0}^{k} (a_n x^n).$$

Such a model can be stored, expressed, and/or communicated in and/or between systems by a vector of coefficient values (9014) [$a_0$ $a_1$ ... $a_k$]. The degree of polynomial can be expressed implicitly by the structure of the vector 9014 and/or explicitly by a value of k. In some embodiments, a model relating to spectrum usage behavior can comprise a combination of models such as the one illustrated 9001 and/or any other known and/or convenient forms of a model. By way of non-limiting example, in some embodiments, a model can comprise a plurality of models that each respectively correspond to a specified range of the independent variable(s), such as x 9002.

Behavior models relating to spectrum usage behavior can be of many forms, and are notably not restricted to analytic functions such as that illustrated by diagram 9001. By way of non-limiting examples, model forms and techniques that can be employed, alone and/or in combination, can be analytic functions, non-analytic functions, discrete models, statistical models, and/or any other known and/or convenient forms and techniques, and/or particularly as well-known in the art.

Diagram 9101 illustrates a behavior model relating user demand N 9110, parameterized quality of service measure(s) QoS 9102 and time of day T 9120. The relationship of user demand to QoS level is shown for times of day $t_1$ 9121, $t_2$ 9122, and $t_3$ 9123, by respectively corresponding curves 9131, 9132, and 9133. Notable values for QoS and N are illustrated as $q_0$ 9104 and $n_0$ 9112, respectively.

At time $t_1$ 9121 essentially all user demand can be met by providing $q_0$ 9104 QoS level. Notably, the customer demand that is met by QoS requirement $q_0$ 9104 (or less), exceeds a (demand) threshold value no 9112 over much of the range. At time $t_2$ 9122 some user demand can be met by providing $q_0$ 9104 QoS, and there is notable demand for QoS above that level. At time $t_3$ 9123 there is essentially no demand for a below $q_0$ 9104 QoS level, and there is notable demand for service above that level.

In some embodiments, the illustrated model 9101 can provide a spectrum usage behavior model 9156 for a pricing decision process 9152, illustrated in diagram 9151. It further relates to the utility of models of reduced order, regards a decision scenario herein described that poses: "What time of day is best (optimal) for a specific service provider to invoke a flat-rate pricing structure?"

The scenario posits that the cost structure 9154 of services provided by a primary provider to a secondary provider typically varies with the number of users and the combined QoS requirements of those users. Notably, the area under the model curve(s) 9131, 9132, and 9133 can be evaluated as a modeled total numbers of users at the specified times of day $t_1$ 9121, $t_2$ 9122, and $t_3$ 9123. Modeled combined QoS requirements for a specified time can be evaluated by a summation $\Sigma_i(n_i q_i)$ of the product of number of users $n_i$ at each QoS level $q_i$, over all QoS levels.

A decision process embodiment 9152 can employ a cost structure 9154 and a spectrum usage behavior model 9156 to generate pricing for clients of the secondary service provider, price(t,q) 9158 which can be responsive to time of day and QoS levels. In one view, a cost structure 9154 can be described as a parameterized supply, and the spectrum usage behavior model 9156 can be described as a parameterized demand, thereby enabling a decision process 9152 to determine a price structure price(t,q) 9158 which can be advantageously optimized to the benefit of a secondary service provider. The secondary service provider can be a system client 710, 801, 9201, 9301, and 9401, as shown and described herein in diagrams respectively 701, 801, 9201, 9301, and 9401.

By way of non-limiting example, in some embodiments, flat pricing, that is, end-user pricing essentially independent of QoS level, can be advantageous to a secondary provider under the condition that the associated incremental costs to the secondary provider for services passed through to an incremental end-user are essentially independent of the QoS of such services. Thus in the event that the primary supplier cost structure 9154 has a feature of being essentially independent of QoS for an incremental user up to a specified threshold number of users and/or specified threshold combined QoS requirements, a decision to provide flat pricing as price(t,q) to an incremental user can be advantageous to the secondary provider under the condition that modeled number of users and combined QoS requirements are below the specified thresholds.

Diagram 9201 illustrates operation of embodiments of a high-level functional level 9250 of a system. The high-level functional level 9250 of diagram 9201 corresponds to "Behavior Pattern Interpretation," also shown as a high-level functional level 750 and 850 as described herein. In some embodiments a work product of this level 9250 can be the instantiation and/or development of one or more models 9252 regarding spectrum usage behavior. Communications between this level 9250 and system clients 9210 can comprise such models. Functional level 9250 can provide usage behavior models to system clients 9210.

Level 9250 can receive, provide, and/or be responsive to information and communications with other levels and elements of a system, including but not limited to databases 9220 such as SUDs, low-level functional level 9230, mid-level functional level 9240, missing value modeling 9260, and/or system clients 9210.

Models 9252 can be responsive to information and communications supplied by other levels and elements of the system, including but not limited to databases 9220 such as SUDS, low-level functional level 9230, mid-level functional level 9240, and/or missing value modeling 9260.

Notably, Models 9252 can be responsive to regression analysis 9251 operations. Regression analysis can notably be applied to the contents of SUDs, comprising database records, to develop models 9252 as described herein.

Regression analysis relating to models of spectrum usage behavior can be of many methods. By way of non-limiting examples, methods that can be employed, alone and/or in combination, can be linear regression, non-linear regression, Bayesian methods, non-Bayesian methods, and/or any other known and/or convenient methods, and/or particularly as well-known in the art.

In some embodiments, models 9252 can comprise analytic models as shown and described herein, notably in regards to Diagram 9001.

By way of nonlimiting examples, model forms and techniques that can be employed, alone and/or in combination, can be analytic functions, non-analytic functions, discrete models, statistical models, and/or any other known and/or convenient forms and techniques, and/or particularly as well-known in the art.

Diagram 9301 illustrates operation of embodiments of a mid-level functional level 9340 of a system. The mid-level functional level 9340 of diagram 9301 corresponds to "Estimation and Prediction Functions" also shown as a mid-level functional level 740 and 840 as described herein. In some embodiments work products of this level 9340 can be estimated values, and/or predicted values. That is, level 9340 can generate estimated and/or predicted values of specified parameters. Communications between this level 9340 and system clients 9310 can comprise such values.

Level 9340 can receive, provide, and/or be responsive to information and communications with other levels and elements of a system, including but not limited to databases 9320 such as SUDs, low-level functional level 9330, high-level functional level 9350, missing value modeling 9360, and/or system clients 9310.

Functions that provide data outside of a considered data set can be described as extrapolating functions, as contrasted with interpolating functions that can be characterized as providing data that falls within the range of a considered data set. In some embodiments, such extrapolating functions can be performed by a functions process module 9342.

Estimation, prediction, and/or extrapolating functions of functions process module 9342 can be responsive to information and communications supplied by other levels and elements of the system, including but not limited to databases 9320 such as SUDs, low-level functional level 9330, high-level functional level 9350, and/or missing value modeling 9360.

Functions of functions process module 9342 can notably be applied to the contents of SUDs, comprising database records, to generate estimated values of specified parameters, as described herein.

Functions for estimating, predicting, and/or extrapolating values, relating to models of spectrum usage behavior, can be of many types. By way of non-limiting examples, functions that can be employed, alone and/or in combination, can be linear, non-linear, statistical, discrete, filtering, and/or any other known and/or convenient functions, and/or particularly as well-known in the art.

Diagram 9401 illustrates operation of embodiments of a low-level functional level 9430 of a system. The low-level functional level 9430 of diagram 9401 corresponds to "Data Averaging and Filtering Functions" also shown as a low-level functional level 730 and 830 as described herein. In some embodiments work products of this level 9430 can be statistical data measures, and/or interpolated values. That is, level 9430 can generate statistical data measures and/or interpolated values. Communications between this level 9430 and system clients 9410 can comprise such values.

Level 9430 can receive, provide, and/or be responsive to information and communications with other levels and elements of a system, including but not limited to databases 9420 such as SUDs, mid-level functional level 9440, high-level functional level 9450, missing value modeling 9460, and/or system clients 9410.

Functions that provide data outside of a considered data set can be described as extrapolating functions, as contrasted with interpolating functions that can be characterized as providing data that falls within the range of a considered data set. In some embodiments, such interpolating functions can be performed by the illustrated interpolating functions 9432 element.

Interpolating functions 9432 and/or statistical data measures 9431 can be responsive to information and communications supplied by other levels and elements of the system, including but not limited to databases 9420 such as SUDs, mid-level functional level 9440, high-level functional level 9450, and/or missing value modeling 9460.

Interpolating functions 9432 can notably be applied to the contents of SUDs, comprising database records, to generate values within the range of a specified SUD. Statistical data measures 9431 can notably be obtained by processing the contents of SUDs, comprising database records, to generate such measures.

Interpolating functions relating to models of spectrum usage behavior, can be of many types. By way of non-limiting examples, functions that can be employed, alone and/or in combination, can be averaging, linear, non-linear, statistical, discrete, filtering, and/or any other known and/or convenient functions, and/or particularly as well-known in the art.

Statistical data measures relating to models of spectrum usage behavior, can be of many types. By way of non-limiting examples, measures that can be employed, alone and/or in combination, can be of one and/or a plurality of variables, averages such as means and/or mediums and/or modes, deviations such as standard deviation, variance, expectation(s), correlation(s), cross-correlation(s), and/or any other known and/or convenient measures, and/or particularly as well-known in the art.

(Modeling) 3. Design and Fine-Tuning a Sampling Campaign

In some embodiments, contents of a database and results of modeling functions can be exploited in order to enhance efficiency of a spectrum usage sensing and sampling campaign. Sampling density along the dimensions of time, space, and frequency can be optimized in response to performance of various analysis functions under varying sampling conditions. Analysis functions can comprise averaging, estimation, and/or modeling functions.

Diagram 1001 depicts techniques for optimizing sampling density. Such techniques can comprise one or more of the following operations:

1010 A ($1^{st}$) database comprising relatively dense usage data can be provided as a starting point;

1012 Various levels of subsampling can be applied to the ($1^{st}$) database in order to develop ($1^{st}$) sparse subsets;

1014 Each of the sparse subsets can be used to populate corresponding ($1^{st}$) subsampled databases;

In one technique, these steps follow step 1014:

1020 A missing value modeling function can be performed on each of the subsampled databases, thereby creating reconstructed samples;

1022 Validity of the reconstructed samples can be evaluated;

1024 For specified constraints, a minimal degree of subsampling, that is, minimal usage sampling, can be determined at least in part in response to the validity of the reconstructed samples.

1030 The minimal degree of subsampling can be applied to the (1 st) database in order to develop a ($2^{nd}$) sparse subset;

1032 The ($2^{nd}$) sparse subset can be used to populate a corresponding ($1^{st}$) minimally subsampled database;

In alternative techniques, these steps follow step 1014:

1050 A variety of functions corresponding to each of the processing levels can be applied to instances of the ($1^{st}$) subsampled database;

1052 Results corresponding to each of the variety of functions can be evaluated;

1054 For specified constraints, a minimal degree of subsampling for each function can be determined at least in part in response to the per-function results.

1060 The minimal degree of subsampling can be applied to the ($1^{st}$) database in order to develop a ($2^{nd}$) sparse subset;

1062 The ($2^{nd}$) sparse subset can be used to populate a corresponding ($1^{st}$) minimally subsampled database;

Such techniques can be employed in studies. Guidelines for spectrum usage sampling campaigns can be based on these findings. Spectrum usage sampling campaigns can thereby be developed and/or used in subsequent sensing operations. Thus, spectrum usage databases can be created and/or populated with improved efficiency.

Diagrams 1101, 1201, 1301, 1401, 1501, and 1601 depict a variety of system embodiments.

Diagram 1101 depicts a system embodiment comprising Service Provider, Sensing Station, Processor, Spectrum Usage Databases, and Server. A Server 1120 can serve as an intermediary between elements Sensing Station 1110, Service Provider 1130, and Processor 1140. Processor 1140 can serve as an intermediary between the Server 1120 and one or more SUDs 1151, 1152, and 1153. In some embodiments Processor 1140 can provide Modeling and other functions as described above.

Diagram 1201 depicts a system embodiment comprising Service Providers, Sensing Stations, Processors, Spectrum Usage Databases, and Server. A Server 1220 can serve as an intermediary between elements that can comprise one or more Sensing Stations 1210, one or more Service Provider 1230, one or more Processors 1240, and one or more SUDs 1251, 1252, and 1253. In some embodiments Processor 1240 can provide Modeling and other functions as described above.

Diagram 1301 depicts a system embodiment comprising Service Providers, Sensing Stations, and cloud-based Processors, Data, and Server. Elements Processors 1340, Server 1320, and Data 1350 can have communications through a network and/or system of interconnected networks such as the Internet. Such networks and/or systems of interconnected networks can be referred to as a "Cloud." In some embodiments Clouds 1322, 1342, and 1352 can overlap and/or interconnect. A 'cloud-based' Server 1320 can serve as an intermediary between elements that can comprise one or more Sensing Stations 1310, one or more Service Provider 1330, one or more Processors, and/or one or more Data elements 1350, such as a SUD. Access and/or communications to/with the Server 1320 can accessed through network services corresponding to the corresponding cloud 1322. In some embodiments, access and/or communications to/with Data 1350 functionality and Processors 1340 functionality can be accessed through network services corresponding to their clouds 1342 and 1352 (respectively). In some embodiments Processors 1340 can provide Modeling and other functions as described above.

Diagram 1401 depicts a system embodiment comprising Service Providers, Sensing Stations, Spectrum Usage Databases, and cloud-based Processor. Cloud-based Processor 1420 can serve as an intermediary between elements that can comprise one or more Sensing Stations 1410, one or more Service Provider 1430, and/or one or more SUDs 1451, 1452, and 1453. In some embodiments Processor 1420 can provide Modeling and other functions as described above.

Diagram 1501 depicts a system embodiment comprising Service Providers, Sensing Stations, and Spectrum Usage Databases. In some embodiments, one or more Service Providers 1530 are coupled with one or more Sensing Stations 1510. The one or more Sensing Stations 1510 can intermediate between Service Providers 1530 and one or more SUDs 1550. In some embodiments, Sensing Stations can each be coupled with their respectively corresponding SUDs.

Diagram 1601 depicts a system embodiment comprising Service Providers, Sensing Stations, Processors, Spectrum Usage Databases, and Server. In some embodiments, Server 1650 can serve as an intermediary between one or more Spectrum Usage Databases 1640, 1642, and 1644 and other elements of the system. In alternative embodiments, other elements of the system can be coupled with the one or more SUDs. Those other elements of the system can comprise one or more Service Providers 1610, 1612, and 1614, one or more Sensing Stations 1620, 1622, and 1624, and one or more Processors 1630, 1632, and 1634. The use of ellipsis in the diagram indicates that additional instances of the 'other' elements can be part of some embodiments. In some embodiments Processors 1630, 1632, and 1634 can provide Modeling and other functions as described above.

Figure 17:
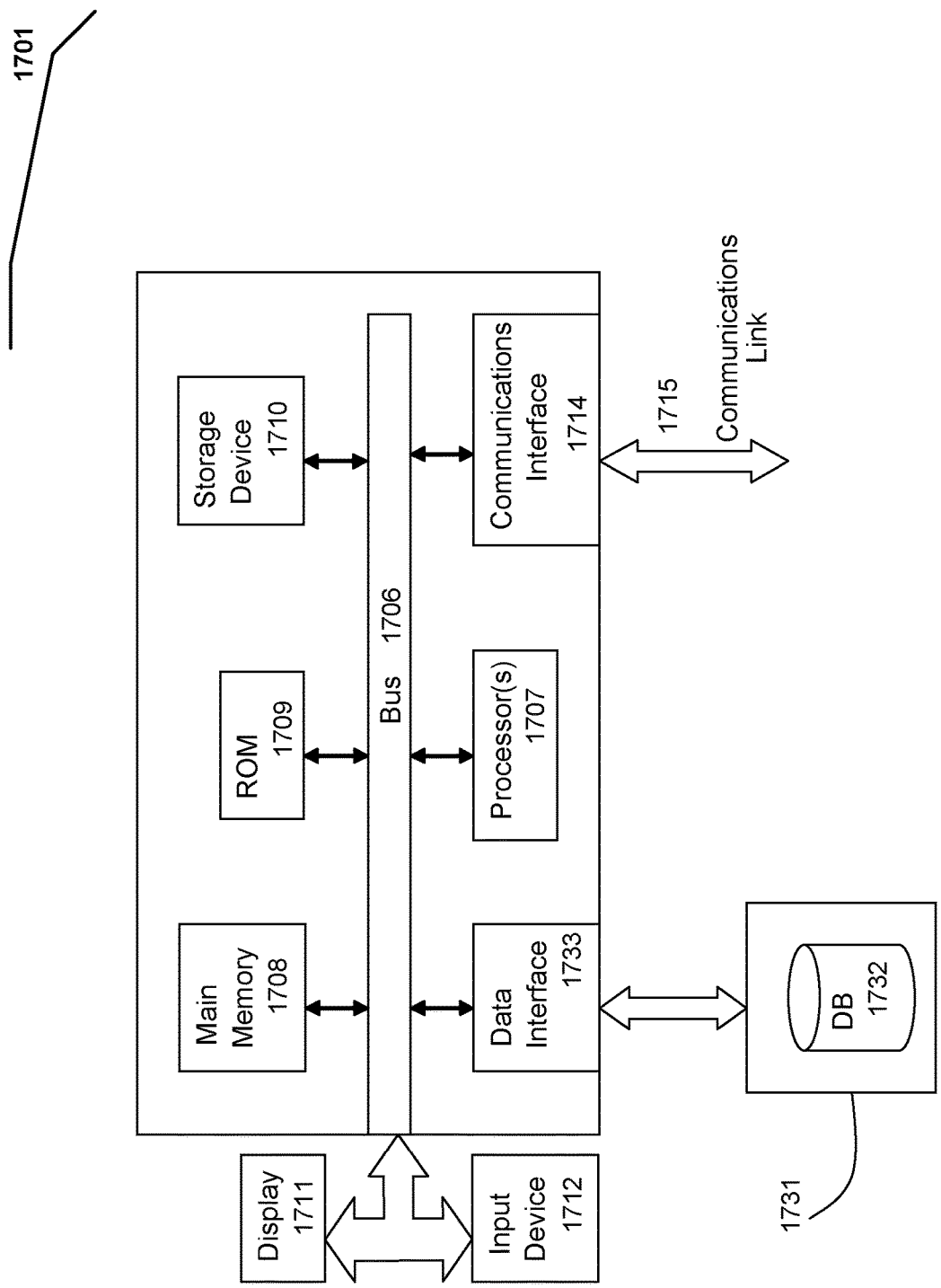
FIG. 17 shows a computer system.

The execution of the sequences of instructions required to practice the embodiments may be performed by a computer system 1701 as shown in FIG. 17. In an embodiment, execution of the sequences of instructions is performed by a single computer system 1701. According to other embodiments, two or more computer systems 1701 coupled by a communication link 1715 may perform the sequence of instructions in coordination with one another. Although a description of only one computer system 1701 will be presented below, however, it should be understood that any number of computer systems 1701 may be employed to practice the embodiments.

A computer system 1701 according to an embodiment will now be described with reference to FIG. 17, which is a block diagram of the functional components of a computer system 1701. As used herein, the term computer system 1701 is broadly used to describe any computing device that can store and independently run one or more programs.

Each computer system 1701 may include a communication interface 1714 coupled to the bus 1706. The communication interface 1714 provides two-way communication between computer systems 1701. The communication interface 1714 of a respective computer system 1701 transmits and receives electrical, electromagnetic or optical signals, that include data streams representing various types of signal information, e.g., instructions, messages and data. A communication link 1715 links one computer system 1701 with another computer system 1701. For example, the communication link 1715 may be a LAN, in which case the communication interface 1714 may be a LAN card, or the communication link 1715 may be a PSTN, in which case the communication interface 1714 may be an integrated services digital network (ISDN) card or a modem, or the communication link 1715 may be the Internet, in which case the communication interface 1714 may be a dial-up, cable or wireless modem.

A computer system 1701 may transmit and receive messages, data, and instructions, including program, i.e., application, code, through its respective communication link 1715 and communication interface 1714. Received program code may be executed by the respective processor(s) 1707 as it is received, and/or stored in the storage device 1710, or other associated non-volatile media, for later execution.

In an embodiment, the computer system 1701 operates in conjunction with a data storage system 1731, e.g., a data storage system 1731 that contains a database 1732 that is readily accessible by the computer system 1701. The computer system 1701 communicates with the data storage system 1731 through a data interface 1733. A data interface 1733, which is coupled to the bus 1706, transmits and receives electrical, electromagnetic or optical signals, that include data streams representing various types of signal information, e.g., instructions, messages and data. In embodiments, the functions of the data interface 1733 may be performed by the communication interface 1714.

Computer system 1701 includes a bus 1706 or other communication mechanism for communicating instructions, messages and data, collectively, information, and one or more processors 1707 coupled with the bus 1706 for processing information. Computer system 1701 also includes a main memory 1708, such as a random access memory (RAM) or other dynamic storage device, coupled to the bus 1706 for storing dynamic data and instructions to be executed by the processor(s) 1707. The main memory 1708 also may be used for storing temporary data, i.e., variables, or other intermediate information during execution of instructions by the processor(s) 1707.

The computer system 1701 may further include a read only memory (ROM) 1709 or other static storage device coupled to the bus 1706 for storing static data and instructions for the processor(s) 1707. A storage device 1710, such as a magnetic disk or optical disk, may also be provided and coupled to the bus 1706 for storing data and instructions for the processor(s) 1707.

A computer system 1701 may be coupled via the bus 1706 to a display device 1711, such as, but not limited to, a cathode ray tube (CRT), for displaying information to a user. An input device 1712, e.g., alphanumeric and other keys, is coupled to the bus 1706 for communicating information and command selections to the processor(s) 1707.

According to one embodiment, an individual computer system 1701 performs specific operations by their respective processor(s) 1707 executing one or more sequences of one or more instructions contained in the main memory 1708. Such instructions may be read into the main memory 1708 from another computer-usable medium, such as the ROM 1709 or the storage device 1710. Execution of the sequences of instructions contained in the main memory 1708 causes the processor(s) 1707 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1707. Such a medium may take many forms, including, but not limited to, non-volatile, volatile and transmission media. Non-volatile media, i.e., media that can retain information in the absence of power, includes the ROM 1709, CD ROM, magnetic tape, and magnetic discs. Volatile media, i.e., media that cannot retain information in the absence of power, includes the main memory 1708. Transmission media includes coaxial cables, copper wire and fiber optics, including the wires that comprise the bus 1706. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

Notably, the present invention may be implemented in a variety of computer systems. The various techniques described herein may be implemented in hardware or software, or a combination of both. Preferably, the techniques are implemented in computer programs executing on programmable computers that each include a processor, a storage medium readable by the processor (including volatile and non-volatile memory and/or storage elements), at least one input device, and at least one output device. Program code is applied to data entered using the input device to perform the functions described above and to generate output information. The output information is applied to one or more output devices. Each program is preferably implemented in a high level procedural or object-oriented programming language to communicate with a computer system. However, the programs can be implemented in assembly or machine language, if desired. In any case, the language may be a compiled or interpreted language. Each such computer program is preferably stored on a storage medium or device (e.g., ROM or magnetic disk)

that is readable by a general or special purpose programmable computer for configuring and operating the computer when the storage medium or device is read by the computer to perform the procedures described above. The system may also be considered to be implemented as a computer-readable storage medium, configured with a computer program, where the storage medium so configured causes a computer to operate in a specific and predefined manner. Further, the storage elements of the exemplary computing applications may be relational or sequential (flat file) type computing databases that are capable of storing data in various combinations and configurations.

By way of examples and not limitations, embodiments of the systems and/or methods described herein, individually and/or in specified combinations, can operate in combination with specified system elements in order to provide useful results. In some embodiments such system elements can comprise computer systems, radio frequency transmitters, and/or radio frequency receivers. Such useful results can comprise generation of and/or transformation of specified signals. In some embodiments the specified signals can be indicative of and/or derived from specified static and/or dynamic characteristics of and/or relating to spectrum usage.

The invention claimed is:

1. A method comprising:
   specifying a spectral range comprising a set of channels, wherein each channel comprises a continuous range of radio frequencies which are adapted to be transmitted into a first geographic location;
   for each channel, tuning a radio frequency receiver of a system to detect the continuous range of radio frequencies of the channel in the first geographic location, and using the system and the radio frequency receiver of the system, during a first temporal length, measuring a signal energy of the continuous range of radio frequencies of the channel;
   determining a subset of the channels based on the signal energies;
   for each channel in the subset of channels, determining a measure of channel occupancy;
   identifying channels of interest within the subset of channels, based on the determined measures of channel occupancy;
   for each channel of interest, tuning the radio frequency receiver to the channel of interest, using the system and the radio frequency receiver of the system, during a second temporal length, determining a transmission format of the channel of interest, and
   determining a measurement of channel usage for the channel of interest based on determining the transmission format;
   updating at least one database record of a spectrum usage database with at least one of the measures of channel usage;
   wherein the database records correspond to samples at least partially populating a sampling grid, sampling indices of the sampling grid comprise a first index for geographic locations into which the set of channels are adapted to be transmitted including the first geographic location and a second geographic location that is different from the first geographic location, a second index for specified time points at which one or more of the channels are transmitted into the first and second geographic locations, and a third index for the ranges of the radio frequencies of the channels;
   populating the sampling grid with samples generated from the samples for the first and second geographic locations, wherein the samples generated from the samples for the first and second geographic locations are for a third geographic location, the first, second, and third geographic locations are different geographic locations, and the first and second geographic locations do not overlap with the third geographic location; and
   generating licensing parameters for a secondary license for transmission of the channels into the third geographic location based on the samples generated for the third geographic location.

2. The method of claim 1 wherein the licensing parameters comprise a licensing price.

3. The method of claim 2 comprising retrieving the samples from the sampling grid for the third geographic location, wherein generating the licensing parameters comprises applying an analysis function to the samples retrieved from the sampling grid.

4. The method of claim 3 wherein the analysis function is based on a usage behavior model of usage of the channels.

5. The method of claim 4 wherein the analysis function uses a portion of the samples retrieved from the sampling grid for generating the licensing parameters.

6. The method of claim 2 comprising filtering the samples generated for the third geographic location and generating the licensing price based on the filtering.

7. The method of claim 6 wherein generating the licensing price is based on the retrieved samples and on the filtered samples.

8. A system comprising:
   a processor;
   a memory coupled to the processor comprising a spectrum usage database; and
   a radio frequency receiver coupled to the processor and adapted to detect radio frequency transmission transmitted into a first geographic region, wherein the processor is adapted to specify a spectral range comprising a set of channels, each channel comprises a continuous range of radio frequencies which are adapted to be transmitted into a first geographic location, and for each channel, tune the radio frequency receiver to detect the continuous range of radio frequencies of the channel in the first geographic location,
   for each channel, during a first temporal length, the radio frequency receiver is adapted to measure a signal energy of the continuous range of radio frequencies of the channel,
   wherein the processor is further adapted to receive information for the signal energies from the radio frequency receiver to determine a subset of the channels based on the signal energies,
   for each channel in the subset of channels, determine a measure of channel occupancy,
   identify channels of interest within the subset of channels, based on the determined measures of channel occupancy, and
   for each channel of interest, tune the radio frequency receiver to the channel of interest,
   for each channel of interest, during a second temporal length, the radio frequency receiver is adapted to detect the channel of interest,
   based on the detected channels of interest, the processor is adapted to determine a transmission format for each channel of interest,
   determine a measurement of channel usage for each channel of interest based on the transmission format for the channel of interest, and update at least one database record of the spectrum usage database with at least one of the measures of channel usage, the database records correspond to samples at least partially populating a sampling grid, sampling indices of the sampling grid comprise a first index for geographic locations into which the set of channels are adapted to be transmitted including the first geographic location and a second geographic location that is different from the first geographic location, a second index for specified time points at which one or more of the channels are transmitted into the first and second geographic locations, and a third index for the ranges of the radio frequencies of the channels;

the processor is further adapted to populate the sampling grid with samples generated from the samples for the first and second geographic locations, the samples generated from the samples for the first and second geographic locations are for a third geographic location, the first, second, and third geographic locations are different geographic locations, and the first and second geographic locations do not overlap with the third geographic location; and the processor is further adapted to generate licensing parameters for a secondary license for transmission of the channels into the third geographic location based on the samples generated for the third geographic location.

9. The system of claim 8 wherein the licensing parameters comprise a licensing price.

10. The system of claim 9 wherein the processor is adapted to retrieve the samples from the sampling grid for the third geographic location, and apply an analysis function to the samples retrieved from the sampling grid to generate the licensing parameters.

11. The system of claim 10 wherein the analysis function is based on a usage behavior model of usage of the channels.

12. The system of claim 11 wherein the analysis function uses a portion of the samples retrieved from the sampling grid for generating the licensing parameters.

13. The system of claim 9 wherein the processor is adapted to filter the samples generated for the third geographic location and generate the licensing price based on the filtered samples.

14. The system of claim 13 wherein generation of the licensing price is based on the retrieved samples and on the filtered samples.

15. The system of claim 8 wherein the radio frequency receiver is not adapted to measure a signal energy of the continuous range of radio frequencies of the channels in the third geographic location.

16. The system of claim 8 wherein the radio frequency receiver is not adapted to measure a signal energy of the continuous range of radio frequencies of the channels in the second geographic location.

17. The system of claim 8 wherein a second radio frequency receiver is adapted to measure a signal energy of the continuous range of radio frequencies of the channels in the second geographic location and not measure the signal energy of the continuous range of radio frequencies of the channels in the first geographic location.

18. The system of claim 17 wherein a second radio frequency receiver is not adapted to measure a signal energy of the continuous range of radio frequencies of the channels in the third geographic location.

19. A method comprising:

specifying a spectral range comprising a set of channels, wherein each channel comprises a continuous range of radio frequencies which are adapted to be transmitted into a first geographic location;

for each channel, tuning a radio frequency receiver of a system to detect the continuous range of radio frequencies of the channel in the first geographic location, and using the system and the radio frequency receiver of the system, during a first temporal length, measuring a signal energy of the continuous range of radio frequencies of the channel;

determining a subset of the channels based on the signal energies;

for each channel in the subset of channels, determining a measure of channel occupancy;

identifying channels of interest within the subset of channels, based on the determined measures of channel occupancy;

for each channel of interest, tuning the radio frequency receiver to the channel of interest, using the system and the radio frequency receiver of the system, during a second temporal length, determining a transmission format of the channel of interest, and determining a measurement of channel usage for the channel of interest based on determining the transmission format;

updating at least one database record of a spectrum usage database with at least one of the measures of channel usage;

wherein the database records correspond to samples at least partially populating a sampling grid, sampling indices of the sampling grid comprise a first index for geographic locations into which the set of channels are adapted to be transmitted including the first geographic location and a second geographic location that is different from the first geographic location, a second index for specified time points at which one or more of the channels are transmitted into the first and second geographic locations, and a third index for the ranges of the radio frequencies of the channels;

populating the sampling grid with samples generated from the samples for the first and second geographic locations, wherein the samples generated from the samples for the first and second geographic locations are for a third geographic location, the first, second, and third geographic locations are different geographic locations, the first and second geographic locations do not overlap with the third geographic location, and the radio frequency receiver is not adapted to measure a signal energy of the continuous range of radio frequencies of the channels in the second and third geographic locations; and generating licensing parameters for a secondary license for transmission of the channels into the third geographic location based on the samples generated for the third geographic location.

20. The method of claim 19 wherein the licensing parameters comprise a licensing price.

* * * * *